(12) United States Patent
Matsuzaki et al.

(10) Patent No.: US 6,510,095 B1
(45) Date of Patent: Jan. 21, 2003

(54) SEMICONDUCTOR MEMORY DEVICE FOR OPERATING IN SYNCHRONIZATION WITH EDGE OF CLOCK SIGNAL

(75) Inventors: Yasurou Matsuzaki, Kawasaki (JP); Hiroyoshi Tomita, Kawasaki (JP); Masao Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/073,231

(22) Filed: Feb. 13, 2002

(30) Foreign Application Priority Data

Sep. 28, 2001 (JP) ........................................ 2001-300892

(51) Int. Cl.[7] ................................................. G11C 7/00
(52) U.S. Cl. .............. 365/222; 365/189.01; 365/189.05
(58) Field of Search ............................ 365/233, 189.05, 365/230.06, 230.08, 230.01, 189.01, 189.12

(56) References Cited

U.S. PATENT DOCUMENTS 6,275,444 B1 * 8/2001 Nakano et al. .............. 365/233
6,295,245 B1 * 9/2001 Tomita et al. ............... 365/222

* cited by examiner

*Primary Examiner*—David Lam
(74) *Attorney, Agent, or Firm*—Arent Fox Kintner Plotkin & Kahn

(57) ABSTRACT

A command receiver circuit receives a command signal in synchronization with either a rising edge or a falling edge of a clock signal. A data input/output circuit starts an output of read data and an input of write data in synchronization with the edges of the clock signal which are set in response to reception timing of the command signal. Since the command signal can be received in synchronization with both edges of the clock signal, it is possible to halve a clock cycle when a reception rate is the same as that of the conventional art. As a result of this, in a system on which the semiconductor memory device is mounted, it is possible to halve the frequency of a system clock and to reduce power consumption of a clock synchronization circuit in the system, without reducing a data input/output rate for the semiconductor memory device.

16 Claims, 16 Drawing Sheets

SEMICONDUCTOR MEMORY DEVICE FOR OPERATING IN SYNCHRONIZATION WITH EDGE OF CLOCK SIGNAL

BACKGROUND OF THE INVENTION

1. Field of the Invention

The present invention relates to a semiconductor memory device of a clock synchronous type and, more particularly, to a technology of reducing power consumption of a system on which the semiconductor memory device is mounted.

2. Description of the Related Art

An SDRAM (Synchronous DRAM) is generally known as the semiconductor memory device of the clock synchronous type. As the SDRAM, there are an SDR (Single Data Rate) type and a DDR (Double Data Rate) type. The SDR-SDRAM accepts a command and an address in synchronization with rising edges of a clock signal CLK, and inputs/outputs data in synchronization with the rising edges of the clock signal CLK. The DDR-SDRAM accepts the command and the address in synchronization with the rising edges of the clock signal and inputs/outputs the data in synchronization with both of the rising edge and a falling edge of the clock signal CLK.

FIG. 1 shows the operation of the SDR-SDRAM. In this example, a read burst length is set as "4". The read burst length is the number of outputting read data successively, in response to one read command RD.

First, an active command ACT is supplied to a bank BK0 in synchronization with the first clock signal CLK, and the bank BK0 is activated (FIG. 1(a)). Next, the active command ACT is supplied to a bank BK1 in synchronization with the second clock signal CLK, and the bank BK1 is activated (FIG. 1(b)).

The read command RD is supplied to the bank BK0 in synchronization with the third clock signal CLK. Data D0 to D3 which are read in the bank BK0 are sequentially latched by a data latch in synchronization with rising edges of an internal clock signal ICLK (FIG. 1(c)). The read data D0 to D3 which are latched by the data latch are outputted sequentially from a data input/output terminal DQ in synchronization with the next rising edges of the internal clock signal 1CLK, respectively (FIG. 1(d)).

Next, the read command RD is supplied to the bank BK1 in synchronization with the eighth clock signal CLK. Data D4 to D7 which are read in the bank BK1 are sequentially latched by the data latch in synchronization with rising edges of the internal clock signal 1CLK (FIG. 1(e)). The read data which are latched by the data latch are outputted sequentially from the data input/output terminal DQ in synchronization with the next rising edges of the internal clock signal 1CLK, respectively (FIG. 1(f)).

The read command RD is supplied again to the bank BK0 in synchronization with the twelfth clock signal CLK, and, similarly to the above, the bank BK0 is operated and read data D8 to D11 are sequentially outputted from the data input/output terminal DQ in synchronization with the rising edges of the internal clock signal ICLK (FIG. 1(g)).

FIG. 2 shows the operation of the DDR-SDRAM. In this example, the read burst length is set as "8". Incidentally, the DDR-SDRAM receives clock signals CLK and /CLK which are complementary to each other.

First, an active command ACT is supplied to a bank BK0 in synchronization with the first clock signal CLK, and the bank BK0 is activated (FIG. 2(a)). Next, the active command ACT is supplied to a bank BK1 in synchronization with the second clock signal CLK, and the bank BK1 is activated (FIG. 2(b)).

A read command RD is supplied to the bank BK0 in synchronization with the third clock signal CLK. Data D0 to D7 which are read in the bank BK0 are outputted to a parallel/serial conversion circuit by two bits, in synchronization with rising edges of an internal clock signal 1CLK (FIG. 2(c)). The parallel/serial conversion circuit sequentially converts the parallel read data (D0 and D1, for example) into serial data. Then, the serial read data D0 to D7 are outputted from a data input/output terminal DQ in synchronization with internal clock signals CLKEVEN and CLKODD which are complementary to each other, respectively (FIG. 2(d)). Namely, in the DDR-SDRAM, the read data D0 to D7 are sequentially outputted in synchronization with both of the rising edges and the falling edges of the clock signal CLK.

Next, the read command RD is supplied to the bank BK1 in synchronization with the eighth clock signal CLK. Data D8 to D15 which are read in the bank BK1 are outputted to the parallel/serial conversion circuit by two bits, in synchronization with the internal clock signal 1CLK (FIG. 2(e)). The parallel/serial conversion circuit converts the parallel read data into the serial data. Then, the serial read data D8 to D15 are outputted from the data input/output terminal DQ, in synchronization with the internal clock signals CLKEVEN and CLKODD which are complementary to each other, respectively (FIG. 2(f)).

The read command RD is supplied again to the bank BK0 in synchronization with the twelfth clock signal CLK, and, similarly to the above, the bank BK0 is operated and read data D16 to D23 are outputted from the data input/output terminal DQ in synchronization with the clock signal CLK (FIG. 2(g)).

The above-described SDR-SDRAM and the DDR-SDRAM accept the command and the address in synchronization with the rising edges of the clock signal CLK at all times. Therefore, a control circuit and the banks BK0 and BK1 inside the SDRAM operate in synchronization with the rising edges of the clock signal CLK, and perform read operation. Further, an output of the first read data is started in synchronization with the rising edge of the clock signal CLK at all times. As to write operation, the command and the address are accepted in synchronization with the rising edges of the clock signal LCK, and reception of write data is started in synchronization with the rising edge of the clock signal CLK, similarly to the read operation.

Thus, according to the conventional SDR-SDRAM and DDR-SDRAM, the command and the address are inputted in synchronization with the rising edges of the clock signal CLK only, and the control circuit and the banks inside the SDRAM are operated at timings with reference to the rising edge of the clock signal CLK. Hence, there is no alternative but to increase a frequency of the clock signal CLK, in order to increase a reception rate of the command. However, when the frequency of the clock signal CLK is increased, the power consumption of a clock synchronization circuit of the system on which the SDRAM is mounted is increased.

Moreover, since an internal circuit of the SDRAM is operated at timing with reference to the rising edge of the clock signal CLK in the conventional art, the assumption is not made that the command and the address are accepted in synchronization with the falling edges of the clock signal CLK. Supposing that the command and the address are accepted in synchronization with the falling edges of the clock signal CLK, it is impossible to operate the internal circuit at the timing with reference to the falling edge of the clock signal CLK. Namely, there is no merit in accepting the command and the address in synchronization with the falling edges of the clock signal CLK.

SUMMARY OF THE INVENTION

It is an object of the present invention to reduce power consumption of a system on which a semiconductor memory device is mounted, without reducing the data input/output rate for the semiconductor memory device.

According to one of the aspects of the semiconductor memory device of the present invention, a command receiver circuit receives a command signal in synchronization with either a rising edge or a falling edge of a clock signal. A timing control circuit sets timing to start outputting read data and timing to start inputting write data by a data input/output circuit at either the rising edge or the falling edge of the clock signal, respectively, in response to the edge of the clock signal in receiving the command signal. The data input/output circuit starts an output of the read data and an input of the write data in synchronization with the edges (either the rising edge or the falling edge of the clock signal) set by the timing control circuit.

For example, in write operation, the timing to start inputting the write data changes in response to reception timing of a write command signal. Similarly, in read operation, the timing to start outputting the read data changes in response to reception timing of a read command signal. Thus, by changing the timing to start operation of the data input/output circuit in response to the reception timing of the command signal, the write operation and the read operation can be performed without delaying the timings the data is input and output, even when the command signal is supplied in synchronization with any edge of the clock signal. In the conventional art, for example, the read data is begun outputting in synchronization with only the rising edge of the clock signal. This applies to both of the semiconductor memory device of an SDR (Single Data Rate) type which inputs and outputs data in synchronization with one of the edges of the clock signal and the semiconductor memory device of a DDR (Double Data Rate) type which inputs and outputs data in synchronization with both edges of the clock signal.

Moreover, since the command receiver circuit can receive the command signal in synchronization with both edges of the clock signal, it is possible to halve a clock cycle when the reception rate of the command signal is the same as that of the conventional art. As a result of this, in the system on which the semiconductor memory device is mounted, it is possible to halve the frequency of a system clock and to reduce the power consumption of the clock synchronization circuit in the system, without reducing the data input/output rate for the semiconductor memory device.

According to another aspect of the semiconductor memory device of the present invention, the data input/output circuit includes a data output part and a data input part. The data output part outputs the read data successively for a plurality of times in synchronization with both edges of the clock signal, in response to the single command signal. The data input part inputs the write data successively for a plurality of times in synchronization with the both edges of the clock signal, in response to the single command signal. Hence, in the system on which the semiconductor memory device having a so-called burst mode function is mounted, it is possible to reduce the power consumption of the clock synchronization circuit in the system.

According to another aspect of the semiconductor memory device of the present invention, a first clock generator generates a first clock signal in synchronization with the rising edge of the clock signal. A second clock generator generates a second clock signal in synchronization with the falling edge of the clock signal. A memory control circuit starts read operation and write operation from/to a memory cell array in synchronization with either the first clock signal or the second clock signal, respectively. A clock selection circuit outputs either the first clock signal or the second clock signal to the memory control circuit, in response to the edge of the clock signal in receiving the command signal.

Thus, the timings to start operation of the read operation and the write operation are changed in response to the reception timing of the command signal so that the write operation and the read operation can be performed at optimum timings without any loss in internal operation, in any of the cases where the command signal is supplied in synchronization with any edge of the clock signal.

The operation start timing of the memory control circuit can be changed only by switching to the first clock signal or to the second clock signal in response to the reception timing of the command signal. Namely, the operation timing of the memory control circuit can be changed by the simple control.

According to another aspect of the semiconductor memory device of the present invention, the command receiver circuit receives the read command signal and the write command signal as command signal. The clock selection circuit outputs either the first clock signal or the second clock signal to the memory control circuit according to a type of the command signal. Thus, by changing the timing to start operation of the memory control circuit is according to the command signal, the clock number from the reception of the read command signal to the start of the output of the read data (read latency) and the clock number from the reception of the write command signal to the start of the input of the write data (write latency) can be freely set without restraint on each other.

According to another aspect of the semiconductor memory device of the present invention, a third clock generator generates a third clock signal whose frequency is double the frequency of the clock signal and is in synchronization with the clock signal. The command receiver circuit receives the command signal in synchronization with the third clock signal. The command receiver circuit is operated in synchronization with one of the edges of the third clock signal, and not with the rising edge or the falling edge of the clock signal, so that the command receiver circuit can be constituted simply. According to another aspect of the semiconductor memory device of the present invention, a third clock generator generates a third clock signal whose frequency is double the frequency of the clock signal and is in synchronization with the clock signal. The data input/output circuit inputs the read data and outputs the write data in synchronization with the third clock signal, respectively. The data input/output circuit is operated in synchronization with one of the edges of the third clock signal, and not with the rising or falling edges of the clock signal, so that the data input/output circuit can be constituted simply.

According to another aspect of the semiconductor memory device of the present invention, the data input/output circuit includes a parallel/serial conversion circuit for converting the parallel read data into serial data and for outputting the converted serial data in synchronization with the third clock signal. The data used inside the semiconductor memory device is in parallel and the data which is outputted to the exterior is in serial, thereby allowing the memory operation cycle to have the margin. As a result of this, it is possible to fabricate the semiconductor memory device by using an inexpensive fabrication technology, and to reduce a fabrication cost of the semiconductor memory device.

According to another aspect of the semiconductor memory device of the present invention, the memory control circuit generates a read transfer signal synchronizing with timing the read data is output from the memory cell array. The data input/output circuit receives the parallel read data in synchronization with the read transfer signal. Namely, the data input/output circuit receives the read data not in synchronization with the clock signal, but by using the read transfer signal which synchronizes with the actual read operation. Therefore, it is possible to transfer the read data to the data input/output circuit in a minimum amount of time and to perform the read operation at high speed.

According to another aspect of the semiconductor memory device of the present invention, the data input/output circuit includes a serial/parallel conversion circuit for converting the serial write data into parallel data and outputting the converted parallel data in synchronization with the third clock signal. The data which is inputted from the exterior is in serial and the data used inside the semiconductor memory device is in parallel, thereby allowing the memory operation cycle to have the margin, similar to the above. As a result of this, it is possible to fabricate the semiconductor memory device by using the inexpensive fabrication technology, and to reduce the fabrication cost of the semiconductor memory device.

According to another aspect of the semiconductor memory device of the present invention, the memory control circuit generates a write transfer signal synchronizing with timing the write data is supplied to the memory cell array. The data input/output circuit outputs the serial write data to the memory cell array in synchronization with the write transfer signal. Namely, the memory cell array receives the write data not in synchronization with the clock signal, but by using the write transfer signal which synchronizes with the actual write operation. Therefore, it is possible to supply the write data to the memory cell array in a minimum amount of time and to perform the read operation at high speed.

According to another aspect of the semiconductor memory device of the present invention, a plurality of banks each include memory cells and operate independently. The memory control circuit is respectively formed corresponding to each of the banks. The memory control circuit is formed for each bank so that the power consumption of the clock synchronization circuit in a system can be reduced, even in the system on which the semiconductor memory device having a plurality of the banks is mounted.

According to another aspect of the semiconductor memory device of the present invention, the banks are connected with the data input/output circuit by a common data bus line which is common to all of the banks, so that the wiring area of the data bus line can be minimized and the chip size of the semiconductor memory device can be reduced.

According to another aspect of the semiconductor memory device of the present invention, the banks are respectively connected with the data input/output circuit by different data bus lines, the connection being done independently from each other. Hence, it is possible to minimize a wiring length of the data bus lines and to reduce the number of transistors to be connected to the data bus lines. Therefore, it is possible to reduce power used for driving the data bus lines and to reduce the power consumption of the semiconductor memory device during operation.

According to another aspect of the semiconductor memory device of the present invention, a data strobe terminal inputs a write data strobe signal in synchronization with an external clock signal during write operation and outputs a read data strobe signal in synchronization with the external clock signal during read operation. The data input/output circuit outputs the read data in synchronization with both edges of the read data strobe signal and inputs the write data in synchronization with both edges of the write data strobe signal. Thus, even in the semiconductor memory device whose clock signal for inputting/outputting the data is a data strobe signal, it is also possible to reduce power consumption of the clock synchronization circuit in the system.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, preferred embodiments of the present invention will be explained with reference to the drawings.

Figure 3:
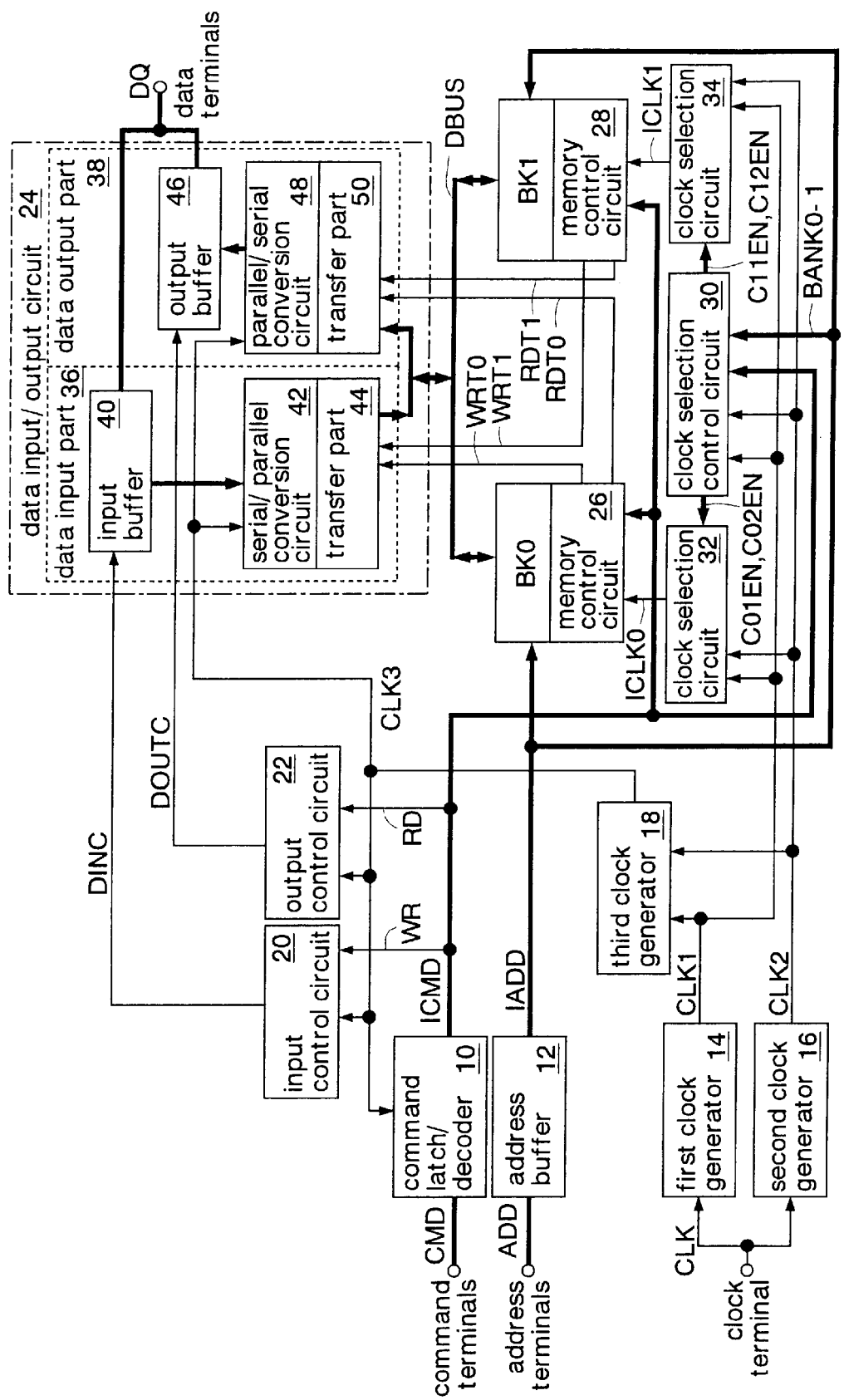
FIG. 3 is a block diagram showing a first embodiment of the semiconductor memory device according to the present invention.

FIG. 3 shows a first embodiment of a semiconductor memory device according to the present invention. This semiconductor memory device is formed on a silicon substrate as a DDR-SDRAM by using a CMOS process.

The SDRAM includes a command latch/decoder 10, an address buffer 12, a first clock generator 14, a second clock generator 16, a third clock generator 18, an input control circuit 20, an output control circuit 22, a data input/output circuit 24, banks BK0 and BK1, memory control circuits 26 and 28, a clock selection control circuit 30 and clock selection circuits 32 and 34. The first clock generator 14, the second clock generator 16, the input control circuit 20, the output control circuit 22, the memory control circuits 26 and 28, the clock selection control circuit 30 and the clock selection circuits 32 and 34 operate as timing control circuits. Each of signal lines shown by bold lines in the drawing consists of a plurality of lines.

The command latch/decoder 10 accepts command signals CMD through command terminals from the exterior, decodes the accepted signals, and outputs these as internal command signals ICMD. As the internal command signals ICMD, there are a write command signal WR for performing write operation, a read command signal RD for performing read operation, active command signals ACT for activating the banks BK0 and BK1, pre-charge command signals for inactivating the banks BK0 and BK1, and the like. The command latch/decoder 10 operates as a command receiver circuit. The address buffer 12 receives address signals ADD through address terminals from the exterior, and outputs the received signals as internal address signals IADD. The internal address signals IADD include later-described decode signals BANK0 and BANK1 of the banks BK0 and BK1.

The first clock generator 14 receives a clock signal CLK through a clock terminal from the exterior, and generates a first clock signal CLK1 having "H" pulses which synchronize with rising edges of the clock signal CLK. The second clock generator 16 generates a second clock signal CLK2 having "H" pulses which synchronize with falling edges of the clock signal CLK. It should be mentioned that the first clock signal CLK1 and the second clock signal CLK2 are generated so that the respective "H" periods do not overlap one another. The third clock generator 18 combines the first and the second clock signals CLK1 and CLK2, and outputs the combined signal as a third clock signal CLK3. Namely, the third clock signal CLK3 is generated by OR logic of the first and the second clock signals CLK1 and CLK2. Since the first and the second clock signals CLK1 and CLK2 do not overlap one another, the frequency of the third clock signal CLK3 is double the frequency of the clock signal CLK, as shown in later-described FIG. 8 and FIG. 9.

In response to activation of the write command signal WR, the input control circuit 20 activates an input control signal DINC for a period corresponding to a write burst length. For example, when the write burst length is "4", the input control signal DINC is activated for a period of four clock cycles of the third clock signal CLK3.

In response to activation of the read command signal RD, the output control circuit 22 activates an output control signal DOUTC for a period corresponding to a read burst length. For example, when the read burst length is "4", the output control signal DOUTC is activated for a period of four clock cycles of the third clock signal CLK3.

The data input/output circuit 24 includes a data input part 36 and a data output part 38. A plurality of the data input parts 36 and the data output parts 38 are formed corresponding to a bit number of data input/output terminals DQ. Each data input part 36 includes an input buffer 40, a serial/parallel conversion circuit 42 and a transfer part 44, and outputs write data which is supplied through the data input/output terminal DQ from the exterior to the banks BK0 and BK1. Each data output part 38 includes an output buffer 46, a parallel/serial conversion circuit 48 and a transfer part 50, and outputs read data which is read from the banks BK0 and BK1 to the exterior through the data input/output terminal DQ.

The input buffer 40 of the data input part 36 operates when the input control signal DINC is activated, and inputs the write data. The serial/parallel conversion circuit 42 converts serial write data transmitted from the input buffer 40 into parallel write data, and outputs the converted data to the transfer part 44. The transfer part 44 outputs the parallel write data through data bus lines DBUS (or DB0 or DB1) to the bank BK0 (or BK1) in synchronization with a write transfer signal WRT0 (or WRT1).

The transfer part 50 of the data output part 38 receives parallel read data transmitted through the data bus lines DBUS from the bank BK0 (or BK1) in synchronization with a read transfer signal RDT0 (or RDT1), and outputs the received data to the parallel/serial conversion circuit 48. The parallel/serial conversion circuit 48 converts the parallel read data into serial read data, and outputs the converted data to the output buffer 46. The output buffer 46 operates when the output control signal DOUTC is activated, and outputs the read data which is transmitted from the parallel/serial conversion circuit 48.

The banks BK0 and BK1 include memory arrays having memory cells, sense amplifiers, row decoders, column decoders and the like (not shown). The row decoders and the column decoders generate the decode signals in response to the internal address signals IADD. The banks BK0 and BK1 are selected in response to the address signals ADD (bank addresses) and each of these operates independently. The banks BK0 and BK1 are connected to the common data bus lines DBUS. Since the data bus lines DBUS are formed in common to the plurality of the banks, a wiring area of the data bus lines DBUS becomes small and hence a chip size can be reduced.

The memory control circuit 26 receives the internal command signals ICMD and an internal clock signal ICLK0 from the clock selection circuit 32, and generates the write transfer signal WRT0, the read transfer signal RDT0 and a control signal (not shown) for controlling the operation of the bank BK0. The memory control circuit 28 receives the internal command signals ICMD and an internal clock signal ICLK1 from the clock selection circuit 34, and generates the write transfer signal WRT1, the read transfer signal RDT1 and a control signal (not shown) for controlling the operation of the bank BK1.

The clock selection control circuit 30 receives the decode signals BANK0 and BANK1 of the bank addresses, out of the first clock signal CLK1, the second clock signal CLK2, the internal command signals ICMD and the internal address signals IADD, and activates any of clock enable signals C01EN, C02EN, C11EN and C12EN. In response to the activation of the clock enable signal C10EN, the clock selection circuit 32 outputs the first clock signal CLK1 as the internal clock signal ICLK0, and, in response to the activation of the clock enable signal C02EN, outputs the second clock signal CLK2 as the internal clock signal ICLK0. In response to the activation of the clock enable signal C11EN, the clock selection circuit 34 outputs the first clock signal CLK1 as the internal clock signal ICLK1, and, in response to the activation of the clock enable signal C12EN, outputs the second clock signal CLK2 as the internal clock signal ICLK1.

Figure 4:
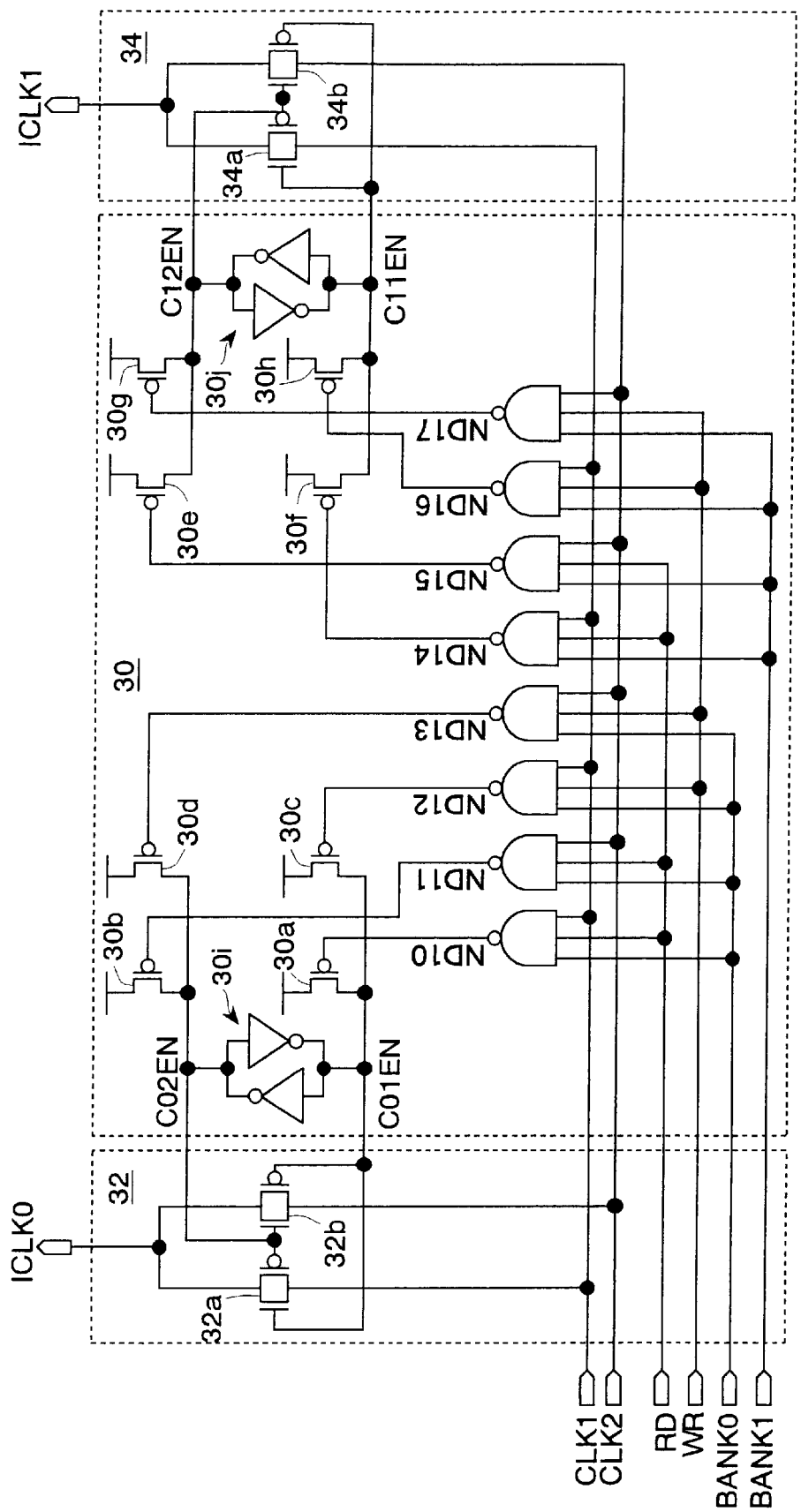
FIG. 4 is a circuit diagram showing the details of a clock selection control circuit and clock selection circuits shown in FIG. 3.

FIG. 4 shows the details of the clock selection control circuit 30 and the clock selection circuits 32 and 34 which are shown in FIG. 3.

The clock selection control circuit 30 includes eight 3-input NAND gates, eight pMOS transistors 30a to 30h, and two latch circuits 30i and 30j. Each NAND gate has three input terminals, each of which receives either the first clock signal CLK1 or the second clock signal CLK2, either the read command signal RD or the write command signal WR, and either the decode signal BANK0 of the bank address or the decode signal BANK1, respectively. The pMOS transistors 30a to 30h receive the outputs of the respective NAND gates by these gates, connect these sources to a power source line, and output any of the clock enable signals C10EN, C02EN, C11EN, and C12EN from these drains.

The clock selection circuit 32 includes two CMOS transmission gates 32a and 32b which are connected in parallel. When the clock enable signal C10EN is activated and the clock enable signal C02EN is inactivated, respectively, the clock selection circuit 32 turns on the CMOS transmission gate 32a to select the first clock signal CLK1, and outputs the selected signal as the internal clock signal ICLK0. Similarly, when the clock enable signal C10EN is inactivated and the clock enable signal C02EN is activated, respectively, the clock selection circuit 32 turns on the CMOS transmission gate 32b to select the second clock signal CLK2, and outputs the selected signal as the internal clock signal ICLK0.

The clock selection circuit 34 includes two CMOS transmission gates 34a and 34b which are connected in parallel. When the clock enable signal C11EN is activated and the clock enable signal C12EN is inactivated, respectively, the clock selection circuit 34 turns on the CMOS transmission gate 34a to select the first clock signal CLK1, and outputs the selected signal CLK1 as the internal clock signal ICLK1. Similarly, when the clock enable signal C11EN is inactivated and the clock enable signal C12EN is activated, respectively, the clock selection circuit 34 turns on the CMOS transmission gate 34b to select the second clock signal CLK2, and outputs the selected signal CLK2 as the internal clock signal ICLK1.

When, for example, the decode signal BANK0 and the read command signal RD are activated during the "H" period of the first clock signal CLK 1, only a node ND10 is changed to a low level, out of the outputs of the NAND gates of the clock selection control circuit 30. At this time, the clock enable signal C10EN is activated and the clock enable signal C02EN is inactivated, respectively, and the internal clock signal ICLK0 which synchronizes with the first clock signal CLK1 is outputted from the clock selection circuit 32 corresponding to the bank BK0.

Alternatively, when the decode signal BANK1 and the write command signal WR are activated during the "H" period of the second clock signal CLK2, only a node ND17 is changed to a low level, out of the outputs of the NAND gates of the clock selection control circuit 30. At this time, the clock enable signal C11EN is inactivated and the clock enable signal C12EN is activated, respectively, and the internal clock signal ICLK1 which synchronizes with the second clock signal CLK2 is outputted from the clock selection circuit 34 corresponding to the bank BK1.

Figure 5:
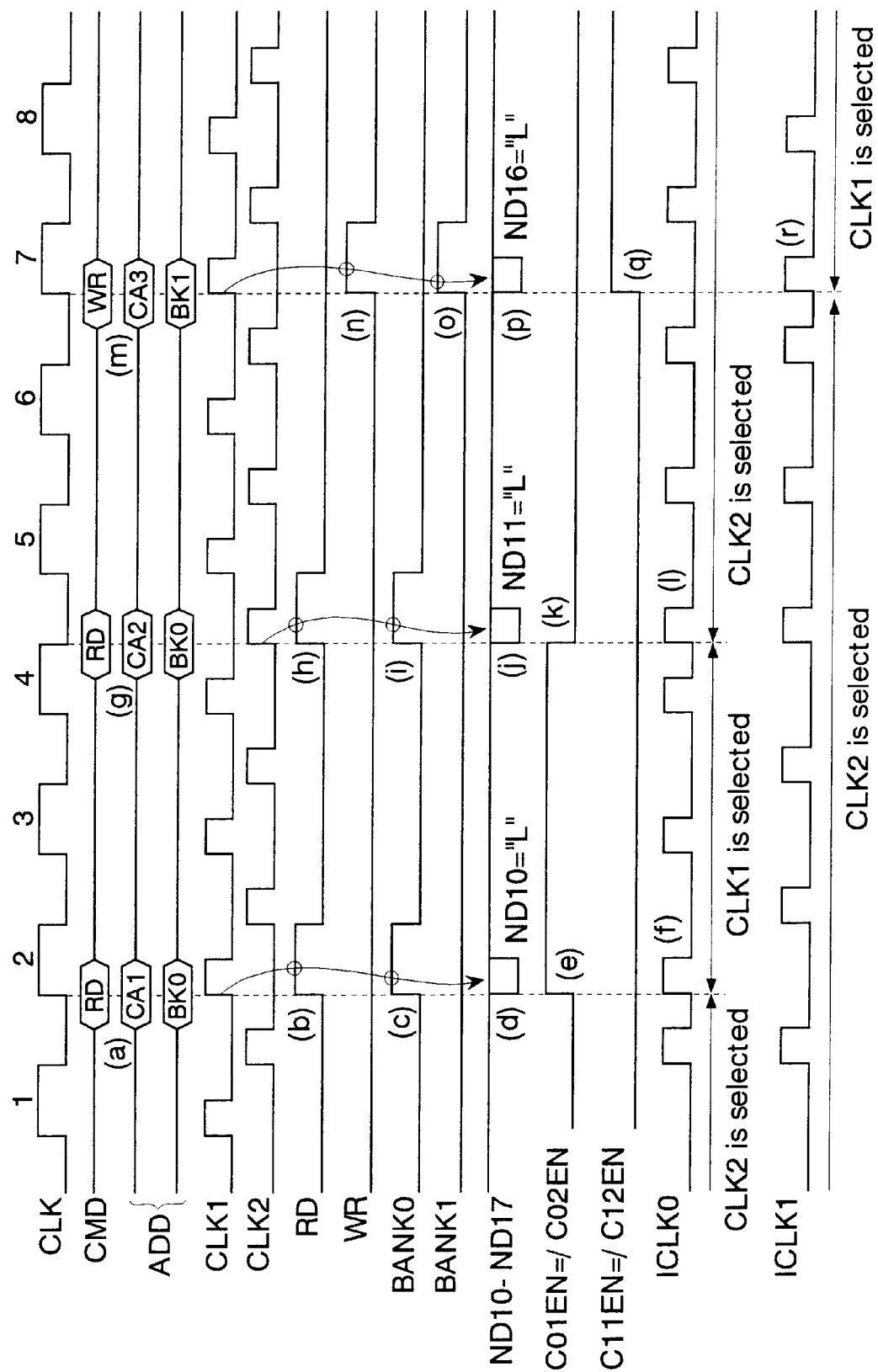
FIG. 5 is a timing chart showing the operation of the clock selection control circuit and the clock selection circuits shown in FIG. 4.

FIG. 5 shows the operation of the clock selection control circuit 30 and the clock selection circuits 32 and 34 which are shown in FIG. 4. In the first state of the drawing, both of the clock selection circuits 32 and 34 output the second clock signal CLK2 as the internal clock signals ICLK0 and ICLK1. At this point, the active commands ACT are already supplied to the banks BK0 and BK1, and the banks BK0 and BK1 are activated. The first and the second clock generators 14 and 16 which are shown in FIG. 3 output the first and the second clock signals CLK1 and CLK2, respectively.

First, in synchronization with the second rising edge of the clock signal CLK, the read command RD and a read address (column address CA1) are supplied to the bank BK0 (FIG. 5(a)). The command latch/decoder 10 activates the read command signal RD for a period of about a half clock (FIG. 5(b)). The address buffer 12 activates the decode signal BANK0 in accordance with the supplied address signal ADD (FIG. 5(c)).

In response to the activation of the read command RD and the decode signal BANK0, the clock selection control circuit 30 keeps nodes ND11 to ND17 at high levels, and changes only the node ND10 to a low level (FIG. 5(d)). Since only the pMOS transistor 30a turns on, the clock enable signal C10EN changes to a high level, and its level is latched by the latch circuit 30i (FIG. 5(e)). Next, the CMOS transmission gate 32a of the clock selection circuit 32 turns on and the first clock signal CLK1 is outputted as the internal clock signal ICLK0 (FIG. 5(f)).

Next, in synchronization with the fourth falling edge of the clock signal CLK, the read command RD and a read address (column address CA2) are supplied to the bank BK0 (FIG. 5(g)). Similarly to the above, the read command signal RD and the decode signal BANK0 are activated for a period of about a half clock (FIGS. 5(h) and (i)).

In response to the activation of the read command RD and the decode signal BANK0, the clock selection control circuit 30 keeps the nodes ND10 and ND12 to ND17 at high levels, and changes only the node ND11 to a low level (FIG. 5(j)). Since only the pMOS transistor 30b turns on, the clock enable signal C10EN changes to a low level, and its level is latched by the latch circuit 30i (FIG. 5(k)). Next, the CMOS transmission gate 32b of the clock selection circuit 32 turns on and the second clock signal CLK2 is outputted as the internal clock signal ICLK0 (FIG. 5(l)).

Next, in synchronization with the seventh rising edge of the clock signal CLK, the write command WR and a write address (column address CA3) are supplied to the bank BK1 (FIG. 5(m)). Then, the write command WR and the decode signal BANK1 are activated for a period of about a half clock (FIGS. 5(m) and (o)).

In response to the activation of the write command WR and the decode signal BANK1, the clock selection control circuit 30 keeps the nodes ND10 to ND15 and ND17 at high levels, and changes only the node ND16 to a low level (FIG. 5(p)). Since only the pMOS transistor 30h turns on, the clock enable signal C11EN changes to a high level, and its level is latched by the latch circuit 30j (FIG. 5(q)). Next, the CMOS transmission gate 34a of the clock selection circuit 34 turns on and the first clock signal CLK1 is outputted as the internal clock signal ICLK1 (FIG. 5(r)).

Figure 6:
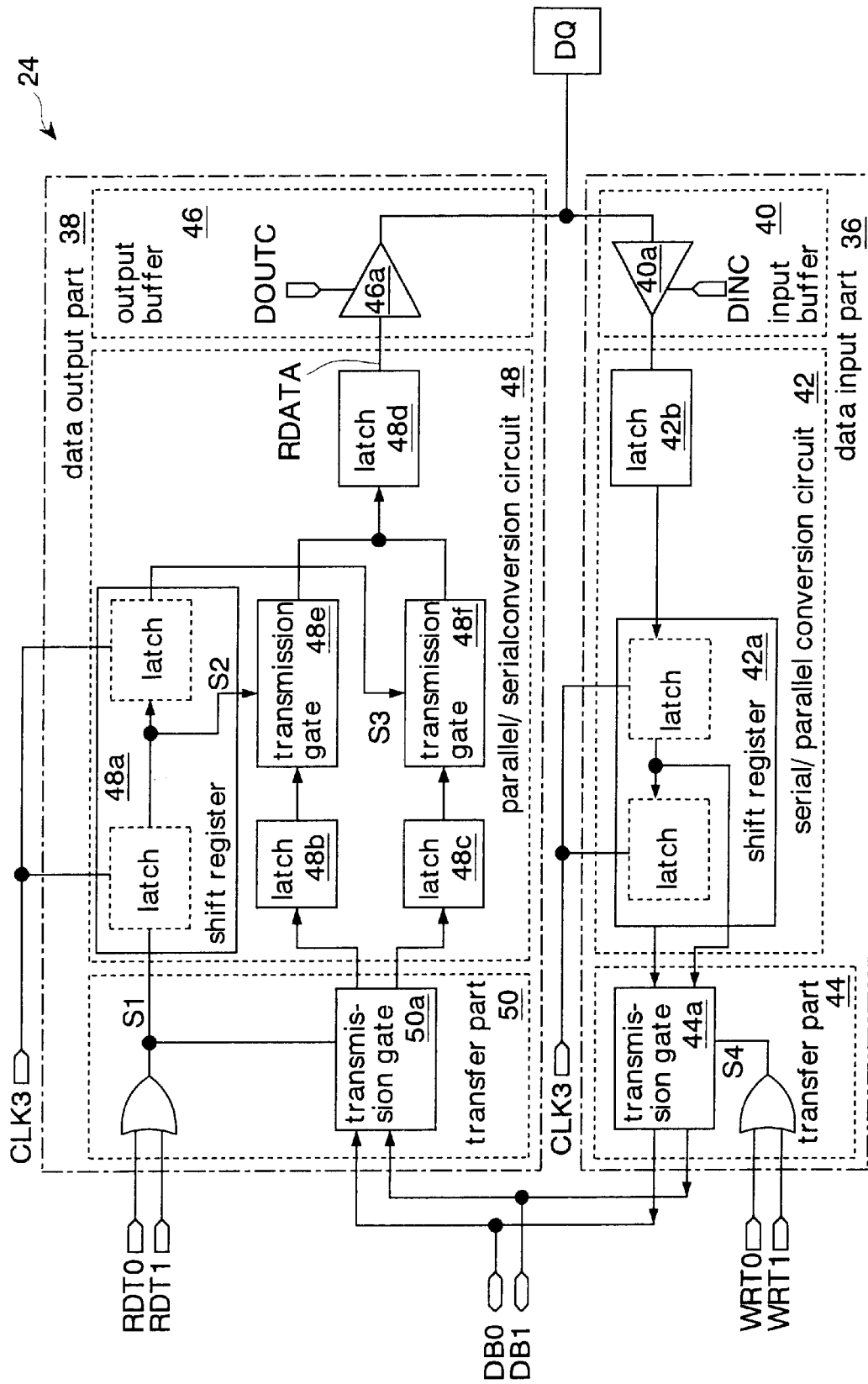
FIG. 6 is a block diagram showing the details of a data input/output circuit shown in FIG. 3.

FIG. 6 shows the details of the data input/output circuit 24 shown in FIG. 3. The circuit corresponding to the 1-bit data input/output terminal DQ is shown in FIG. 6.

The transfer part 50 of the data output part 38 includes a transmission gate 50a which turns on in synchronization with activation of a selection signal S1 (OR logic of the read transfer signals RDT0 and RDT1). When the transmission gate 50a turns on, the parallel read data which is read through 2-bit data bus lines DB0 and DB1 is outputted to the parallel/serial conversion circuit 48.

The parallel/serial conversion circuit 48 includes a shift register 48a, latches 48b, 48c and 48d, and transmission gates 48e and 48f. The shift register 48a includes two latches which are connected in series, and responds to the activation of the selection signal S1 in synchronization with the rising edges of the third clock signal to alternately output selection signals S2 and S3.

The latches 48b and 48c respectively latch the read data from the transmission gate 50a, and output the latched data to the transmission gates 48e and 48f. The transmission gates 48e and 48f sequentially turn on in synchronization with the selection signals S2 and S3, and output the read data from the latch 48b or 48c to the latch 48d. Namely, the parallel read data is converted into the serial data. The latch 48d sequentially latches the serial read data, and outputs the latched read data to the output buffer 46.

The output buffer 46 includes a buffer 46a which outputs the read data from the parallel/serial conversion circuit 48 to the data input/output terminal DQ in synchronization with the output control signal DOUTC.

Meanwhile, the input buffer 40 of the data input part 36 includes a buffer 40a which receives the write data supplied to the data input/output terminal DQ, in synchronization with the input control signal DINC.

The serial/parallel conversion circuit 42 includes a shift register 42a and a latch 42b. The latch 42b latches the write data from the input buffer 40, and outputs the latched data to the shift register 42a. The shift register 48a includes two latches which are connected in series. The two latches of the shift register 48a sequentially receive the write data in synchronization with the rising edges of the third clock signal, and output the received data respectively to the transfer part 44. Namely, the serial write data is converted into the parallel data.

The transfer part 44 includes a transmission gate 44a which turns on in synchronization with activation of a selection signal S4 (OR logic of the write transfer signals WRT0 and WRT1). When the transmission gate 44a turns on, the parallel write data (two bits) is outputted to the data bus lines DB0 and DB1.

Figure 7:
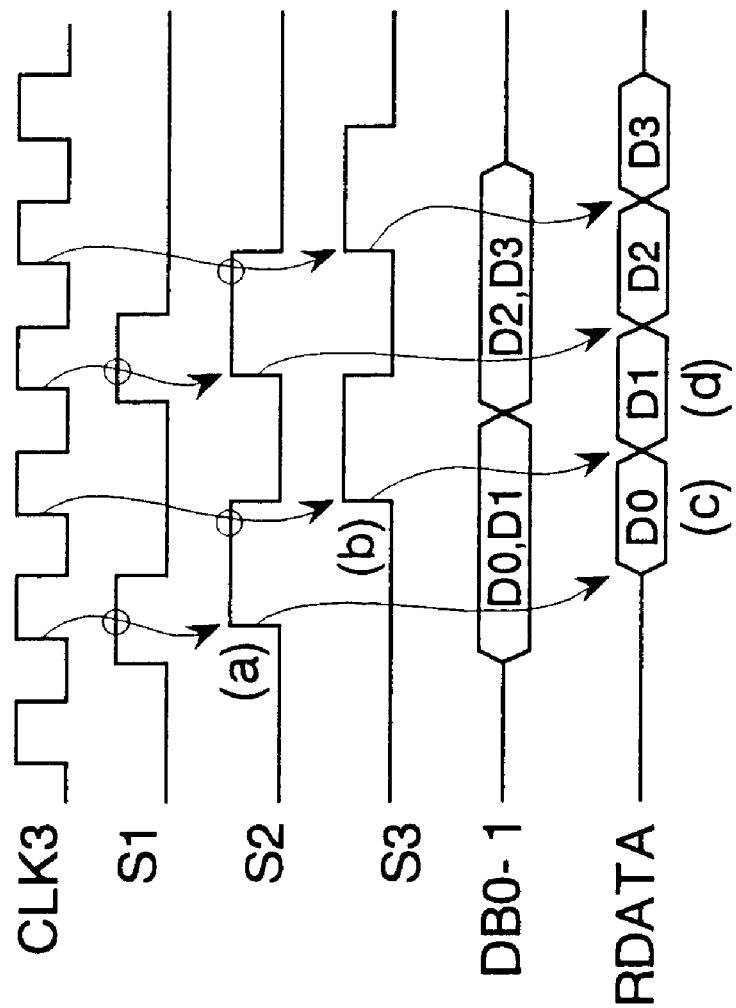
FIG. 7 is a timing chart showing the operation of a parallel/serial conversion circuit shown in FIG. 6.

FIG. 7 shows the operation of the parallel/serial conversion circuit 48 shown in FIG. 6. The parallel/serial conversion circuit 48 responds to the activation of the selection signal S1 (the read transfer signal RDT0 or RDT1) in synchronization with the rising edges of the third clock signal CLK3, to alternately activate the selection signals S2 and S3 (FIGS. 7(a) and (b)). Since the transmission gates 48e and 48f alternately turn on in synchronization with the rising edges of the selection signals S2 and S3, parallel read data D0 and D1 (or D2 and D3) are converted into serial read data RDATA (FIGS. 7(c) and (d)).

Figure 8:
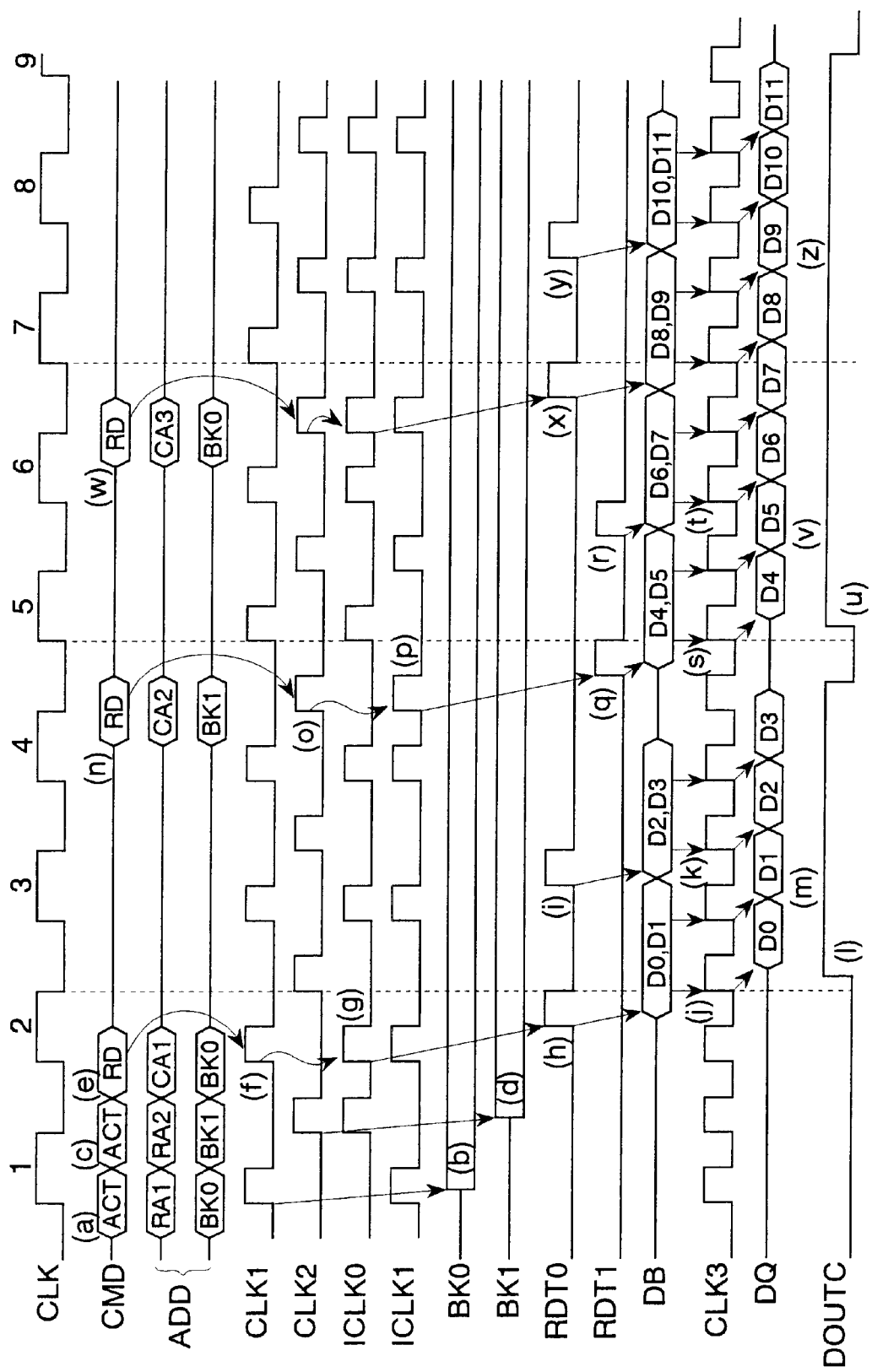
FIG. 8 is a timing chart showing read operation of the semiconductor memory device according to the first embodiment.

FIG. 8 shows read operation of the DDR-SDRAM according to the first embodiment. In this example, the command signals CMD and the address signals ADD are supplied in synchronization with both of the rising edges and the falling edges of the clock signal CLK. The read burst length is set as "4".

First, the active command ACT is supplied to the bank BK0 in synchronization with the first rising edge of the clock signal CLK (FIG. 8(a)). The bank BK0 is activated in synchronization with the first clock signal CLK1 corresponding to the rising edge of the clock signal CLK (FIG. 8(b)). Next, the active command ACT is supplied to the bank BK1 in synchronization with the first falling edge of the clock signal CLK (FIG. 8(c)). The bank BK1 is activated in synchronization with the second clock signal CLK2 corresponding to the falling edge of the clock signal CLK (FIG. 8(d)).

Next, the read command RD is supplied to the bank BK0 in synchronization with the second rising edge of the clock signal CLK (FIG. 8(e)). When the read command RD is supplied in synchronization with the rising edge of the clock signal CLK, the memory control circuit 26 (FIG. 3) which corresponds to the bank BK0 operates in synchronization with the first clock signal CLK1 (FIG. 8(f)). Namely, the clock selection circuit 32 (FIG. 4) selects the first clock signal CLK1, and outputs the selected first clock signal CLK1 as the internal clock signal ICLK0 (FIG. 8(g)).

The memory control circuit 26 starts its operation in synchronization with the rising edges of the clock signal CLK (first clock signal CLK1). The memory control circuit 26 activates the read transfer signal RDT0 twice, in synchronization with the first clock signal CLK1 corresponding to the second and the third rising edges of the clock signal CLK (FIGS. 8(h) and (i)). The parallel read data D0 and D1, and D2 and D3 which are read from the bank BK0 are transferred to the parallel/serial conversion circuit 48 in synchronization with the read transfer signal RDT0.

The parallel/serial conversion circuit 48 converts the parallel read data D0 and D1, and D2 and D3 into the serial data in synchronization with the rising edges of the third clock signal CLK3 (FIGS. 8(j) and (k)). Incidentally, by forming the parallel/serial conversion circuit 48, it is possible to make the number of the data bus lines DBUS larger than the number of the data input/output terminals DQ. By making a bit width inside the SDRAM larger than a bit width of an external interface, it is possible to allow operation cycles of the banks BK0 and BK1 to have margins.

In response to the read command RD, the output control circuit 22 (FIG. 3) activates the output control signal DOUTC for a period of two clock cycles (FIG. 8(l)). Then, the serial read data D0 to D3 are sequentially outputted from the output buffer 46, in synchronization with the falling edges and the rising edges of the clock signal LCK (FIG. 8(m)). Namely, when the read command RD is supplied in synchronization with the rising edge of the clock signal CLK, the first read data is outputted in synchronization with the falling edge of the clock signal CLK (read latency=0.5 clock).

Next, the read command RD is supplied to the bank BK1 in synchronization with the fourth falling edge of the clock signal CLK (FIG. 8(n)). When the read command RD is supplied in synchronization with the falling edge of the clock signal CLK, the memory control circuit 28 (FIG. 3) which corresponds to the bank BK1 operates in synchronization with the second clock signal CLK2 (FIG. 8(o)). Namely, the clock selection circuit 34 (FIG. 4) selects the second clock signal CLK2, and outputs the selected second clock signal CLK2 as the internal clock signal ICLK1 (FIG. 8(p)).

The memory control circuit 28 starts its operation in synchronization with the falling edges of the clock signal CLK (second clock signal CLK2). The memory control circuit 28 activates the read transfer signal RDT1 twice, in synchronization with the second clock signal CLK2 corresponding to the fourth and the fifth falling edges of the clock signal CLK (FIG. 8(q) and (r)). Read data D4 and D5, and D6 and D7 which are read from the bank BK1 are transferred to the parallel/serial conversion circuit 48 in synchronization with the read transfer signal RDT1.

The parallel/serial conversion circuit 48 converts the parallel read data D4 and D5, and D6 and D7 into the serial data in synchronization with the rising edges of the third clock signal CLK3 (FIG. 8(s) and (t)). In response to the read command RD, the output control circuit 22 activates the output control signal DOUTC for a period of two clock cycles (FIG. 8(u)). Actually, the next read command RD is supplied in synchronization with the sixth falling edge of the clock signal CLK, and hence the output control signal DOUTC is activated until the ninth rising edge of the clock signal CLK. Then, the serial read data D4 to D7 are sequentially outputted from the output buffer 46, in synchronization with the rising edges and the falling edges of the clock signal CLK (FIG. 8(v)). Namely, when the read command RD is supplied in synchronization with the falling edge of the clock signal CLK, the first re ad data is outputted in synchronization with the rising edge of the clock signal CLK (read latency=0.5 clock). Thus, according to the present invention, timing to start outputting the read data changes in response to reception timing of the read command signal RD.

Next, the read command RD to the bank BK0 is supplied in synchronization with the sixth falling edge of the clock signal CLK (FIG. 8(w)). Similarly to the above, the memory control circuit 26 starts its operation in synchronization with the falling edges of the clock signal CLK (second clock signal CLK2). The memory control circuit 26 activates the read transfer signal RDT0 twice, in synchronization with the second clock signal CLK2 corresponding to the sixth and the seventh falling edges of the clock signal CLK (FIGS. 8(x) and (y)). Then, similarly to the above, parallel read data D8 and D9 and read data D10 and D11 which are read from the bank BK0 are converted into serial data, and sequentially outputted in synchronization with the rising edges and the falling edges of the clock signal CLK (FIG. 8(z)).

Figure 9:
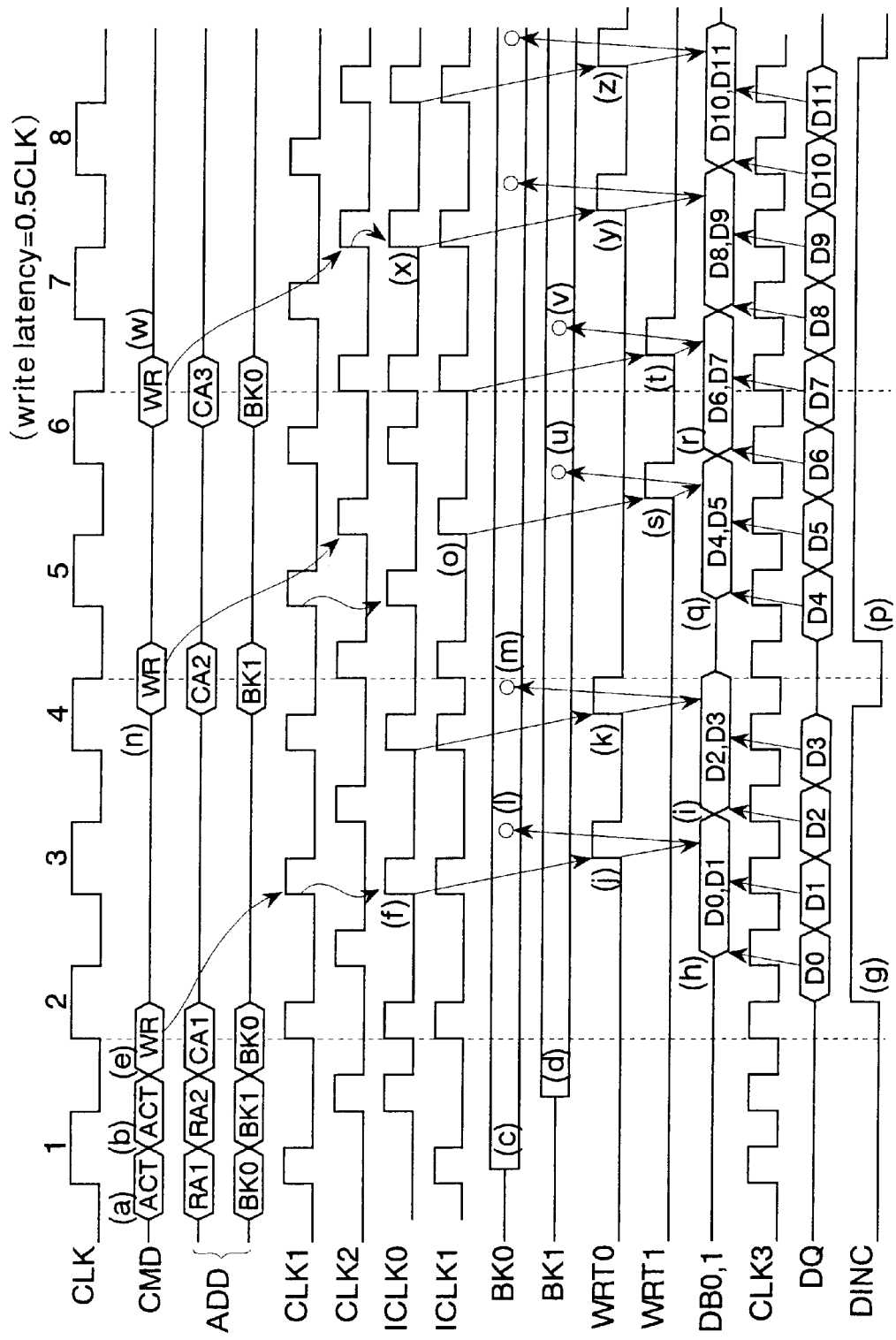
FIG. 9 is a timing chart showing write operation of the semiconductor memory device according to the first embodiment.

FIG. 9 shows write operation of the DDR-SDRAM according to the first embodiment. Similarly to FIG. 8, the command signals CMD and the address signals ADD are supplied in 15 synchronization with the rising edges and the falling edges of the clock signal CLK. A write burst length is set as "4". Write latency is set as 0.5 clock. It should be mentioned that the write burst length is the number of receiving the write data successively, in response to one write command WR. The write latency is the clock number from the reception of the write command WR to the reception of the first write data.

First, the active commands ACT to the bank BK0 and the bank BK1 are supplied in synchronization with the first rising edge and the falling edge of the clock signal CLK, respectively (FIGS. 9(a) and (b)). The banks BK0 and BK1 are respectively activated in response to the active commands ACT (FIGS. 9(c) and (d)).

Next, the write command WR is supplied to the bank BK0 in synchronization with the second rising edge of the clock signal CLK (FIG. 9(e)). When the write command WR is supplied in synchronization with the rising edge of the clock signal CLK, the memory control circuit 26 (FIG. 3) which corresponds to the bank BK0 operates in synchronization with the first clock signal CLK1. Namely, the clock selection circuit 32 (FIG. 4) selects the first clock signal CLK1, and outputs the selected first clock signal CLK1 as the internal clock signal ICLK0 (FIG. 9(f)).

In response to the write command WR, the input control circuit 20 (FIG. 3) activates the input control signal DINC for a period of two clock cycles (FIG. 9(g)). The input buffer 40 receives a first write data D0 in synchronization with the second falling edge of the clock signal CLK. Serial write data D0 and D1, and D2 and D3 are sequentially converted into parallel data in the serial/parallel conversion circuit 42, and transmitted to the data bus lines DB0 and DB1 (FIGS. 9(h) and (i)). Incidentally, by forming the serial/parallel conversion circuit 42, it is possible to make the number of the data bus lines DBUS larger than the number of the data input/output terminals DQ, and to allow the operation cycles of the banks BK0 and BK1 to have margins, similarly to the case of forming the parallel/serial conversion circuit 48.

The memory control circuit 26 activates the write transfer signal WRT0 twice, in synchronization with the first clock signal CLK1 corresponding to the third and the fourth rising edges of the clock signal CLK (FIGS. 9(f) and (k)). Then, the write data D0 and D1, and D2 and D3 are transferred to the bank BK0 in synchronization with the write transfer signal WRT0 and written into the memory cells (FIGS. 9(l) and (m)). Next, the write command WR to the bank BK1 is supplied in synchronization with the fourth falling edge of the clock signal CLK (FIG. 9(n)). When the write command WR is supplied in synchronization with the falling edge of the clock signal CLK, the memory control circuit 28 (FIG. 3) which corresponds to the bank BK1 operates in synchronization with the second clock signal CLK2. Namely, the clock selection circuit 34 (FIG. 4) selects the second clock signal CLK2, and outputs the selected second clock signal CLK2 as the internal clock signal ICLK1 (FIG. 9(o)).

In response to the write command WR, the input control circuit 20 activates the input control signal DINC for a period of two clock cycles (FIG. 9(p)). Actually, the next write command WR is supplied in synchronization with the sixth falling edge of the clock signal CLK, and hence the input control signal DINC is activated until the eighth falling edge of the clock signal CLK. The input buffer 40 receives a first write data D4 in synchronization with the fifth rising edge of the clock signal CLK. Thus, according to the present invention, timing to start inputting the write data changes in response to reception timing of the write command signal WR. Serial write data D4 and D5, and D6 and D7 are sequentially converted into parallel data in the serial/parallel conversion circuit 42, and transferred to the data bus lines DB0 and DB1 (FIGS. 9(q) and (r)).

The memory control circuit 28 activates the write transfer signal WRT1 twice, in synchronization with the second clock signal CLK2 corresponding to the fifth and the sixth falling edges of the clock signal CLK (FIGS. 9(s) and (t)). Then, the write data D4 and D5, and D6 and D7 are transferred to the bank BK1 in synchronization with the write transfer signal WRT1, and written into the memory cells (FIGS. 9(u) and (v)).

Next, the write command WR is supplied to the bank BK0 in synchronization with the sixth falling edge of the clock signal CLK (FIG. 9(w)). When the write command WR is supplied in synchronization with the falling edge of the clock signal CLK, the memory control circuit 26 which corresponds to the bank BK0 operates in synchronization with the second clock signal CLK2. Namely, the clock selection circuit 32 selects the second clock signal CLK2, and outputs the selected second clock signal CLK2 as the internal clock signal ICLK0 (FIG. 9(x)).

The memory control circuit 26 activates the write transfer signal WRT0 twice, in synchronization with the second clock signal CLK2 corresponding to the seventh and the eighth falling edges of the clock signal CLK (FIG. 9(y) and (z)). Then, the write operation to the bank BK0 is performed, similarly to the above.

Figure 1:
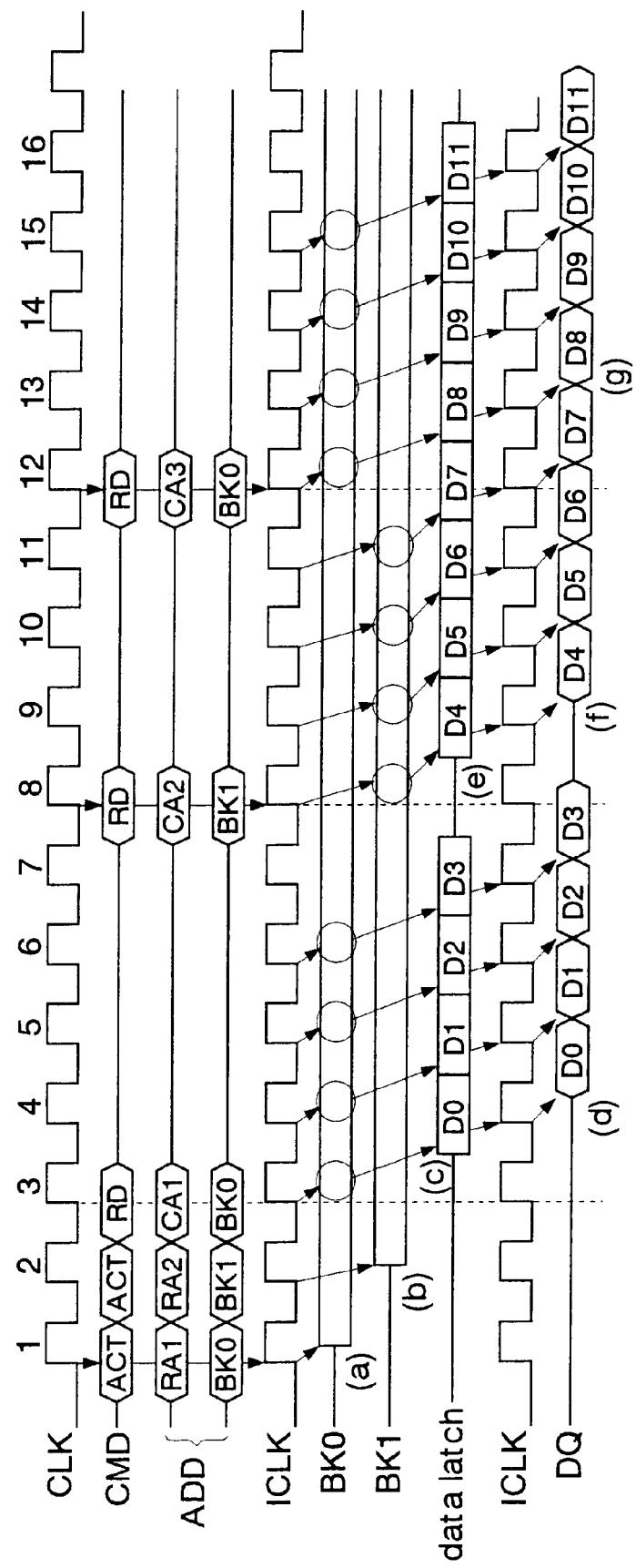
FIG. 1 is a timing chart showing read operation of a conventional SDR-SDRAM.
Figure 2:
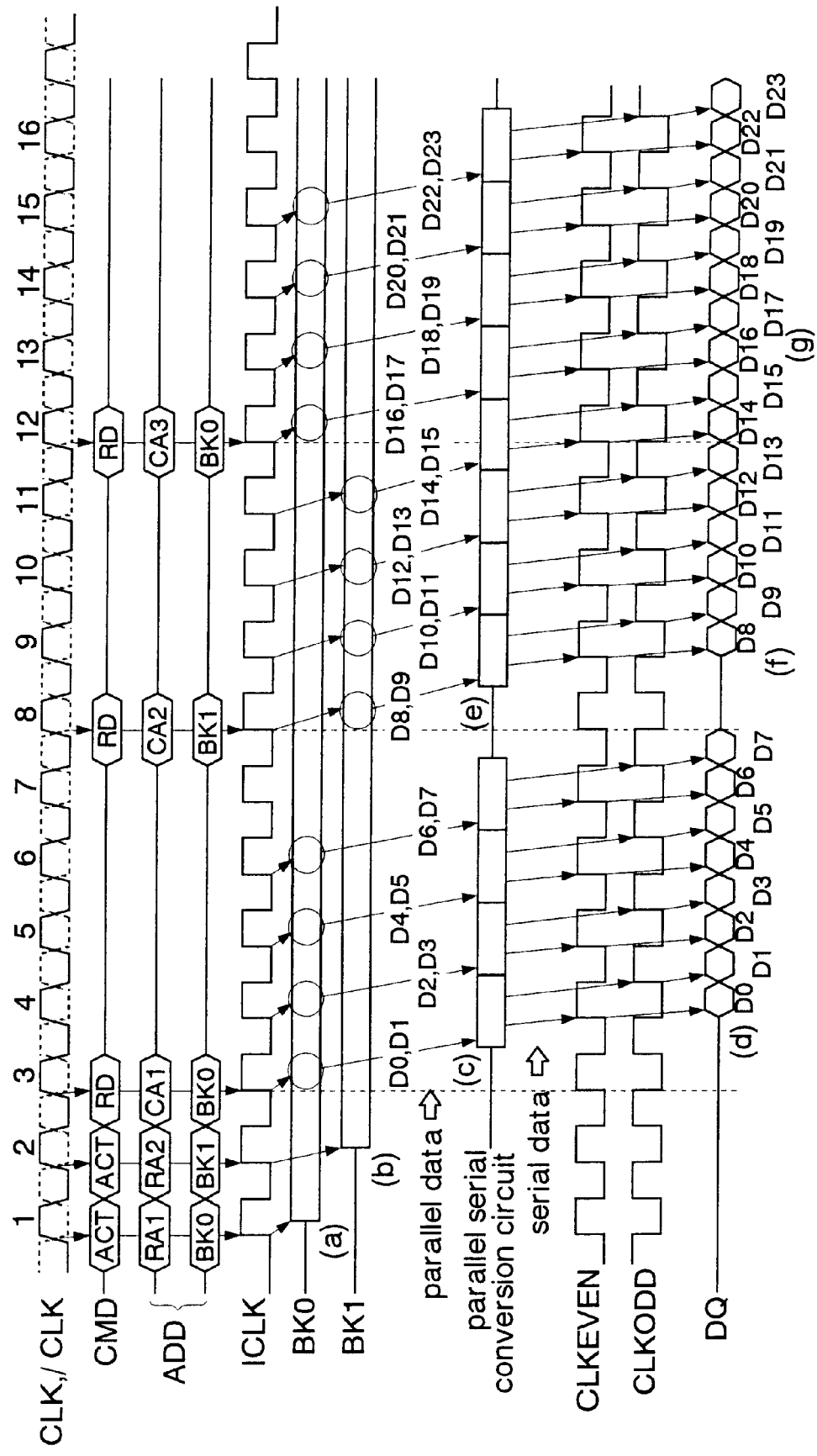
FIG. 2 is a timing chart showing the read operation of a conventional DDR-SDRAM.

As is clear from the comparison of the FIG. 8 and FIG. 9 to FIG. 1, according to the present invention, it is possible to halve the frequency of the clock signal CLK which is supplied from the exterior, without changing a reception rate of the command signal and a data input/output rate.

As described above, according to this embodiment, the timing to start outputting the read data is changed in response to the reception timing of the read command signal RD, in the read operation. Further, in the write operation, the timing to start inputting the write data is changed in response to the reception timing of the write command signal WR. Therefore, it is possible to perform the read operation and the write operation without delaying the timing the data is input/output, in any of the cases where the command signals RD and WR are supplied in synchronization with any edges of the clock signal CLK.

The command latch/decoder 10 receives the command signals RD and WR in synchronization with both edges of the clock signal CLK and changes the timings to start operation of the memory control circuits 26 and 28 in response to the reception timings of the command signals RD and WR, and therefore, it is possible to halve the frequency of the clock signal CLK which is supplied from the exterior, without changing the reception rate of the command signal and the data input/output rate. As a result of this, power consumption of a clock synchronization circuit of a system on which the DDR-SDRAM is mounted can be reduced as compared with the conventional art.

The clock selection control circuit 30 and the clock selection circuits 32 and 34 select either the first clock signal CLK1 or the second clock signal CLK2 in response to the edges of the clock signal CLK in receiving the command signals CMD, and output the selected clock signals to the memory control circuits 26 and 28. The memory control circuits 26 and 28 control the banks BK0, BK1 and the data input/output circuit 24 in synchronization with the supplied clock signals. Namely, according to the present invention, the timings of the read operation and the write operation are changed by selecting the first clock signal CLK1 or the second clock signal CLK2. Hence, it is almost unnecessary to change the memory control circuits, the banks and the data input/output circuit of the conventional DDR-SDRAM in using these. Therefore, it is highly effective especially when the present invention is applied to the SDRAM of the DDR type (SDRAM having a burst function). In this case, it is almost unnecessary to change the memory control circuits, the banks and the data input/output circuit, and hence a development period of the product can be shortened.

The timings to start operation of the memory control circuits 26 and 28 can be changed only by switching to the first clock signal CLK1 or to the second clock signal CLK2 in response to the reception timings of the command signals CMD. Namely, the operation timings of the memory control circuits can be changed by the simple control.

Since the command latch/decoder 10 and the data input/output circuit 24 are operated in synchronization with one of the edges of the third clock signal CLK3, not with the rising edge and the falling edge of the clock signal CLK, it is possible to constitute the command latch/decoder 10 and the data input/output circuit 24 simply.

Since the parallel/serial conversion circuit 48 and the serial/parallel conversion circuit 42 are formed, it is possible to allow the operation cycles of the banks BK0 and BK1 to have the margins. As a result of this, it is possible to fabricate the semiconductor memory device by using an inexpensive fabrication technology, and to reduce a fabrication cost of the semiconductor memory device.

Since the banks BK0 and BK1 are connected with the data input/output circuit 24 by the common data bus lines DBUS, it is possible to minimize the wiring area of the data bus lines DBUS and to reduce the chip size of the DDR-SDRAM.

Figure 10:
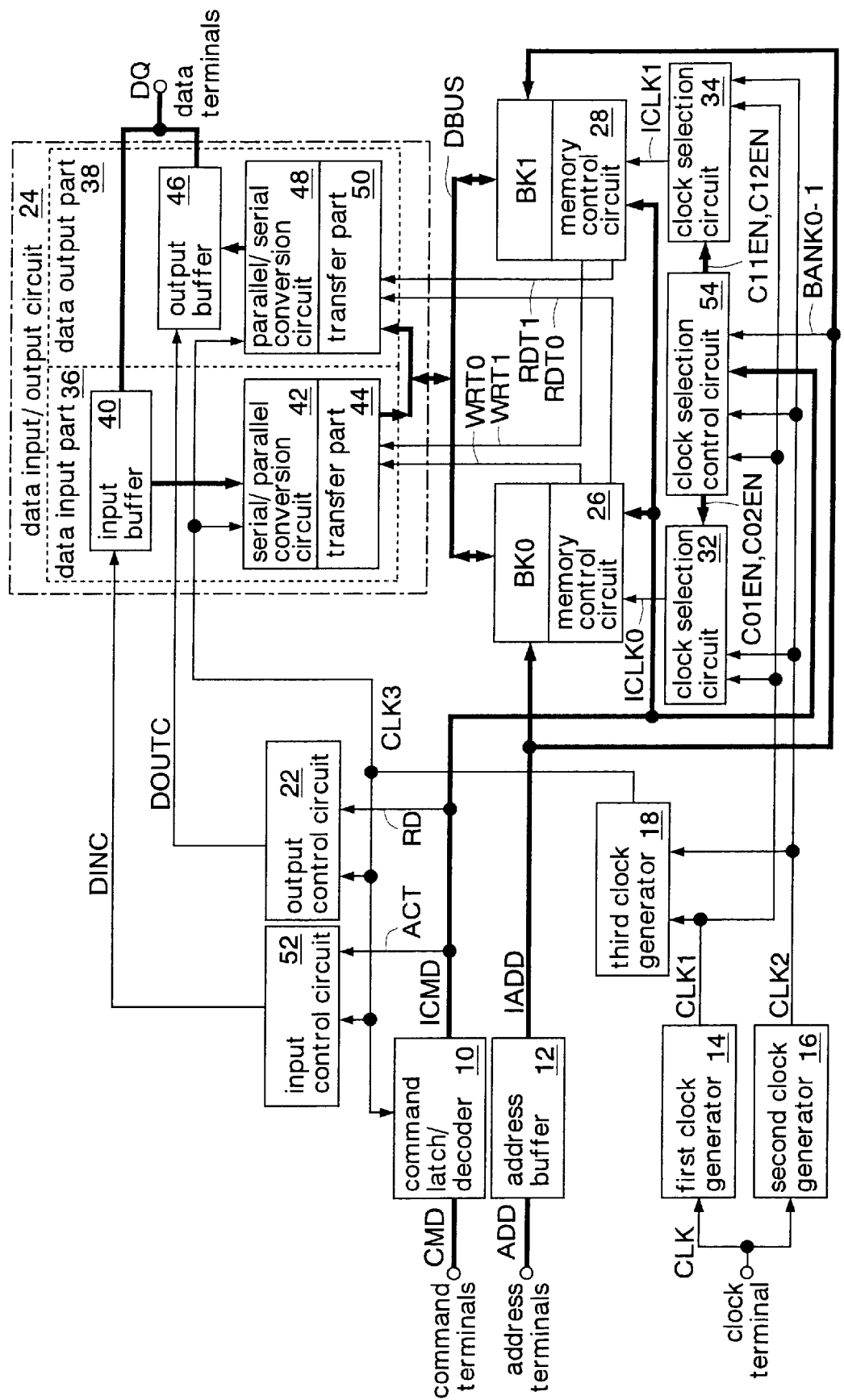
FIG. 10 is a block diagram showing a second embodiment of the semiconductor memory device according to the present invention.

FIG. 10 shows a second embodiment of the semiconductor memory device according to the present invention. The same numerals and symbols are given to designate the same circuits and signals as those explained in the description of the related art and the first embodiment, and detailed explanations thereof will be omitted.

In this embodiment, a clock selection control circuit 54 is formed instead of the clock selection control circuit 30 of the first embodiment. Further, an active command ACT, not the write command signal WR, is supplied to the input control circuit 52. The rest of the structure is the same as that of the first embodiment.

Figure 11:
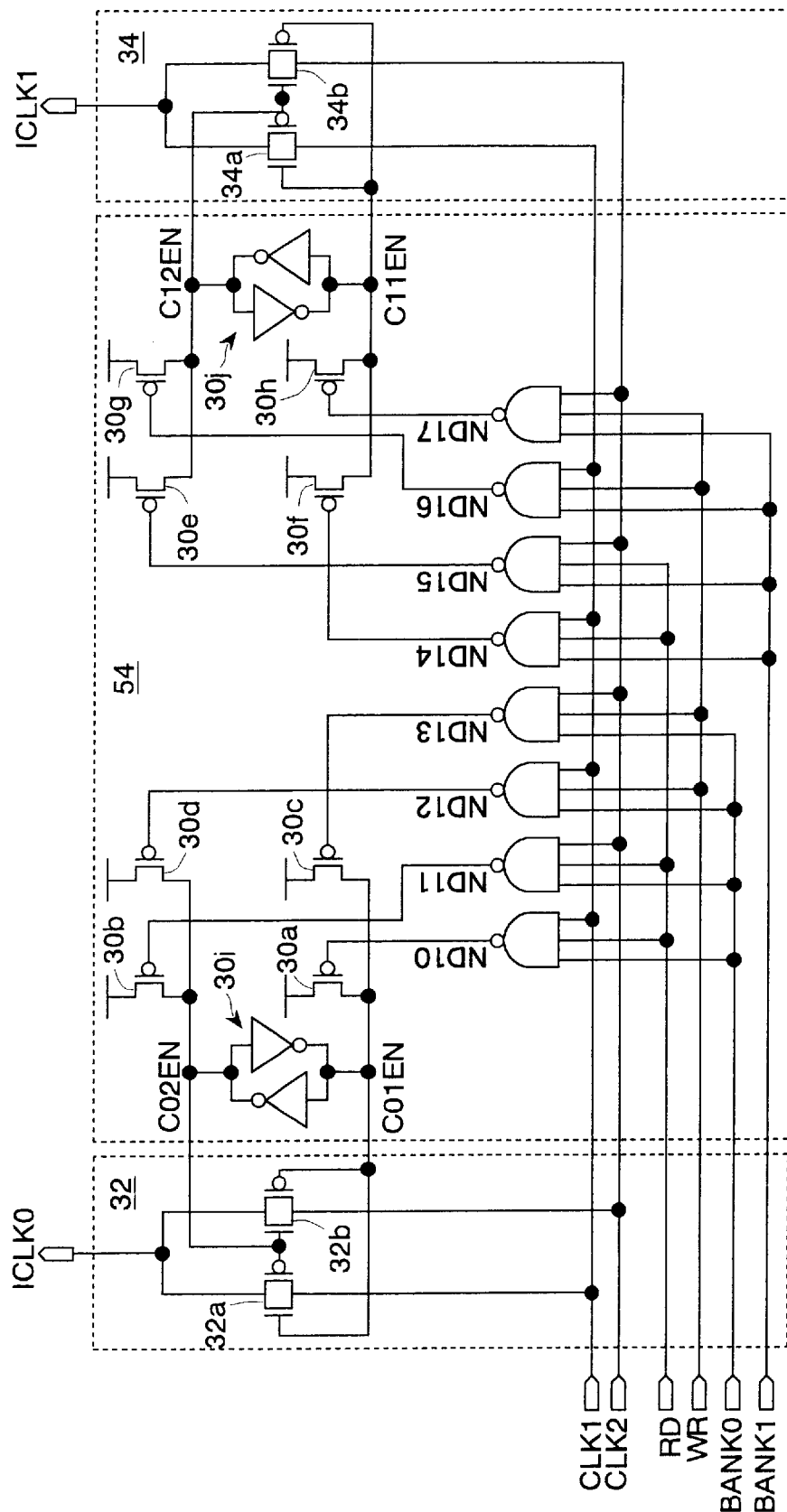
FIG. 11 is a circuit diagram showing the details of a clock selection control circuit and clock selection circuits shown in FIG. 10.

FIG. 11 shows the details of the clock selection control circuit 54 and the clock selection circuits 32 and 34. The clock selection control circuit 54 is the same as the clock selection control circuit 30 of the first embodiment (FIG. 4), except that the outputs of the NAND gates to which the write command signal WR is supplied (nodes ND12, ND13, ND16 and ND17) are connected to different destinations. The node ND12 is connected to the gate of the pMOS transistor 30d from which the clock enable signal C02EN is outputted. The node ND13 is connected to the gate of the pMOS transistor 30c from which the clock enable signal C01EN is outputted. The node ND16 is connected to the gate of the pMOS transistor 30g from which the clock enable signal C12EN is outputted. The node ND17 is connected to the gate of the pMOS transistor 30h from which the clock enable signal C11EN is outputted.

In this embodiment, the clock signals which are selected when the write command WR is supplied are opposite to those of the first embodiment. For example, when the decode signal BANK0 and the write command signal WR are activated during the "H" period of the first clock signal CLK1, the clock selection circuit 32 outputs the second clock signal CLK2 as the internal clock signal ICLK0. Further, when the decode signal BANK1 and the write command signal WR are activated during the "H" period of the second clock signal CLK2, the clock selection circuit 34 outputs the internal clock signal ICLK1 which synchronizes with the first clock signal CLK1.

Figure 12:
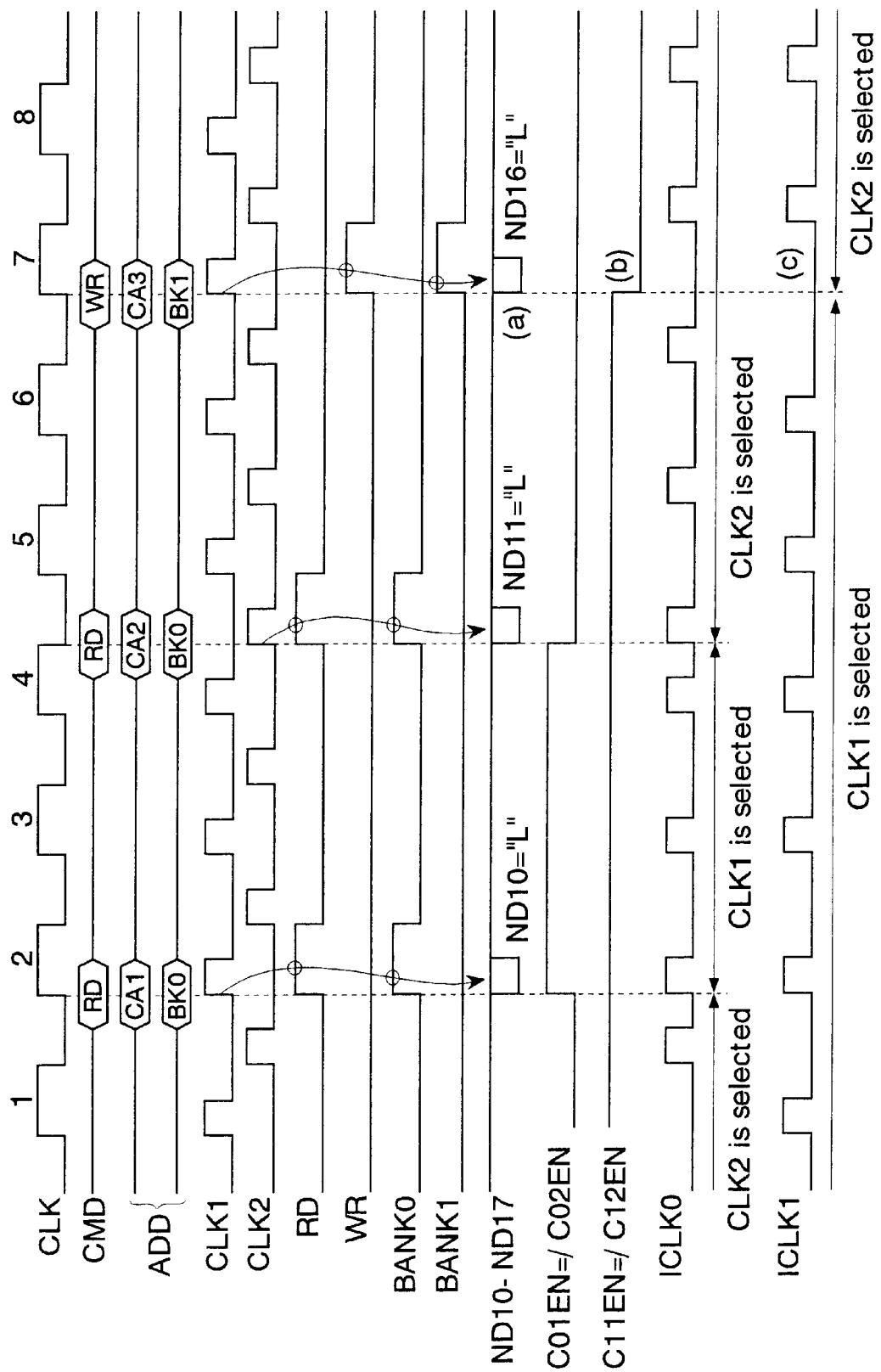
FIG. 12 is a timing chart showing the operation of the clock selection control circuit and the clock selection circuits shown in FIG. 11.

FIG. 12 shows the operation of the clock selection control circuit 54 and the clock selection circuits 32 and 34 which are shown in FIG. 11. In the first state of the drawing, the clock selection circuit 32 outputs the second clock signal CLK2 as the internal clock signal ICLK0, and the clock selection circuit 34 outputs the first clock signal CLK1 as the internal clock signal ICLK0. The command signals CMD and the address signals ADD are supplied from the exterior at the same timings as those of FIG. 5.

In this example, when only the node ND16 changes to a low level in synchronization with the seventh rising edge of the clock signal CLK (FIG. 12(a)), only the pMOS transistor 30g, not the pMOS transistor 30h, turns on, whereby the clock enable signal CllEN changes to a low level and its level is latched by the latch circuit 30j (FIG. 12(b)). Next, the CMOS transmission gate 34b of the clock selection circuit 34 turns on and the second clock signal CLK2 is outputted as the internal clock signal ICLK1 (FIG. 12(c)). The first to the sixth clock cycles are the same as those of the above-described FIG. 5, except that the first clock signal CLK1 is selected as the internal clock signal ICLK1.

Figure 13:
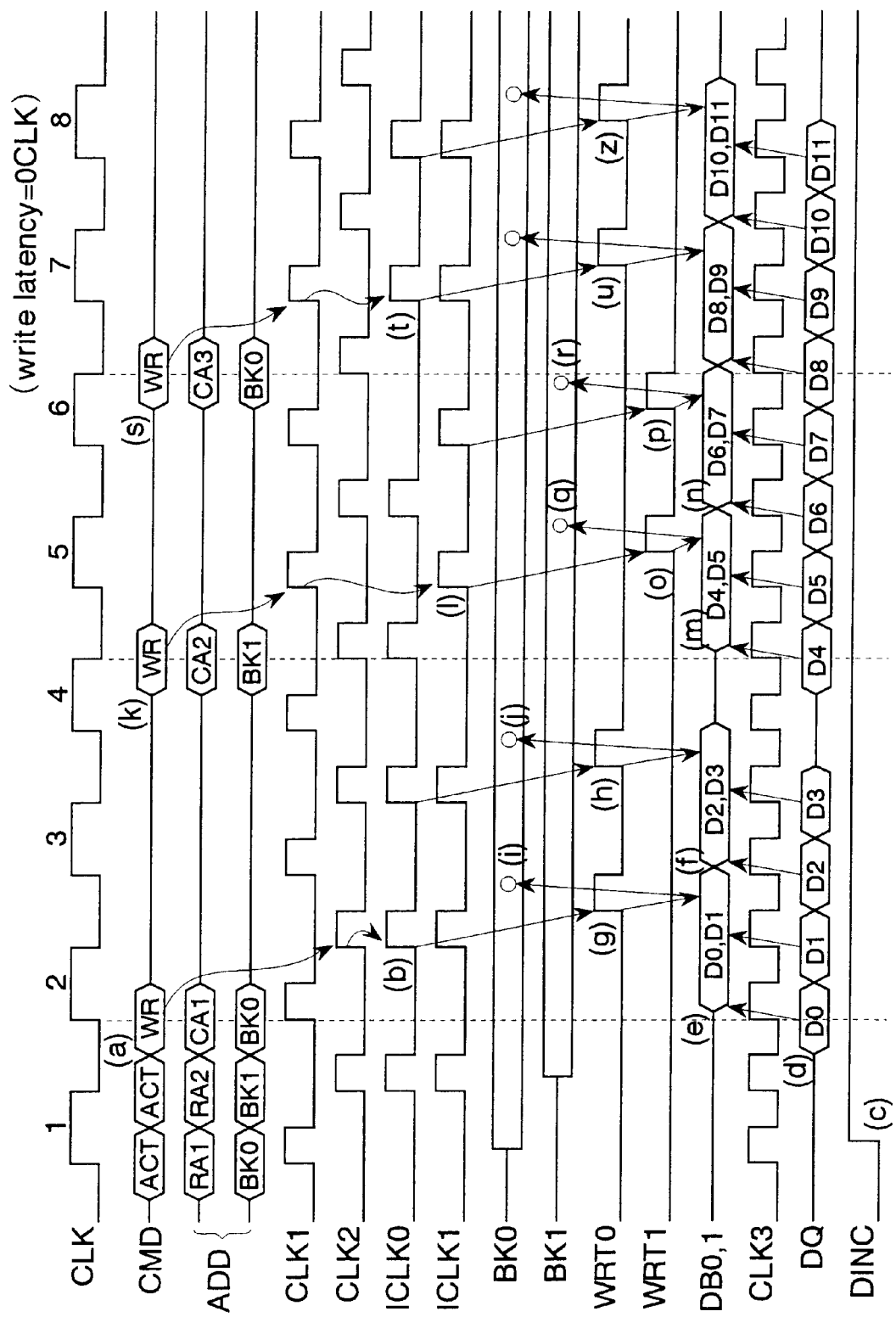
FIG. 13 is a timing chart showing write operation of the semiconductor memory device according to the second embodiment.

FIG. 13 shows write operation of the DDR-SDRAM according to the second embodiment. The command signals CMD and the address signals ADD which are supplied from the exterior are the same as those of the above-described FIG. 9. In this embodiment, write latency during the write operation is set as 0 clock.

The timings until the banks BK0 and BK1 are activated are the same as those of FIG. 9, and hence explanations thereof are omitted. First, the write command WR to the bank BK0 is supplied in synchronization with the second rising edge of the clock signal CLK (FIG. 13(a)). When the write command WR is supplied in synchronization with the rising edge of the clock signal CLK, the memory control circuit 26 (FIG. 10) which corresponds to the bank BK0 operates in synchronization with the second clock signal CLK2. Namely, the clock selection circuit 32 (FIG. 4) selects the second clock signal CLK2 by the control of the clock selection control circuit 54, and outputs the selected clock signal CLK2 as the internal clock signal ICLK0 (FIG. 13(b)).

In response to the active command ACT, the input control circuit 20 (FIG. 10) activates the input control signal DINC (FIG. 13(c)). The input control signal DINC is inactivated in response to a pre-charge command (not shown). Write data D0 is supplied simultaneously with the write command WR (FIG. 13(d)). The input buffer 40 sequentially receives write data D0 to D3. The serial write data D0 and D1, and D2 and D3 are converted into parallel data in the serial/parallel conversion circuit 42, and transmitted to the data bus lines DB0 and DB1 (FIGS. 13(e) and (f)).

The memory control circuit 26 activates the write transfer signal WRT0 twice, in synchronization with the second clock signal CLK2 corresponding to the second and the third falling edges of the clock signal CLK (FIGS. 13(g) and (h)). Then, the write data D0 and D1, and D2 and D3 are written into the bank BK0 in synchronization with the write transfer signal WRT0 (FIGS. 13(i) and (j))

Next, the write command WR to the bank BK1 is supplied in synchronization with the fourth falling edge of the clock signal CLK (FIG. 13(k)). When the write command WR is supplied in synchronization with the falling edge of the clock signal CLK, the memory control circuit 28 (FIG. 10) which corresponds to the bank BK1 operates in synchronization with the first clock signal CLK1. Namely, the clock selection circuit 34 (FIG. 11) selects the first clock signal CLK1, and outputs the selected clock signal CLK1 as the internal clock signal ICLK1 (FIG. 13(l)).

Serial write data D4 and D5, and D6 and D7 are converted into parallel data in the serial/parallel conversion circuit 42, and transmitted to the data bus lines DB0 and DB1 (FIGS. 13(m) and (n)). The memory control circuit 28 activates the write transfer signal WRT1 twice, in synchronization with the first clock signal CLK1 corresponding to the fifth and the sixth rising edges of the clock signal CLK (FIGS. 13(o) and (p)). Then, the write data D4 and D5, and D6 and D7 are transferred to the bank BK1 in synchronization with the write transfer signal WRT1, and written into the memory cells (FIGS. 13(q) and (r)).

Next, the write command WR to the bank BK0 is supplied in synchronization with the sixth falling edge of the clock signal CLK (FIG. 13(s)). When the write command WR is supplied in synchronization with the falling edge of the clock signal CLK, the memory control circuit 26 which corresponds to the bank BK0 operates in synchronization with the first clock signal CLK1. Namely, the clock selection circuit 32 selects the first clock signal CLK1, and outputs the selected clock signal CLK1 as the internal clock signal ICLK0 (FIG. 13(t)).

The memory control circuit 26 activates the write transfer signal WRT0 twice, in synchronization with the first clock signal CLK1 corresponding to the seventh and the eighth rising edges of the clock signal CLK (FIGS. 13(u) and (v)). Then, the write operation to the bank BK0 is performed, similarly to the above.

Incidentally, the timings of read operation according to the present invention are the same as those of the above-described first embodiment (FIG. 8). In FIG. 8, the output of the read data is started after a half clock from the supply of the read command signal RD. Meanwhile, in FIG. 13, the input of the write data is started simultaneously with the supply of the write command WR. Namely, when the read command signal RD and the write command signal WR are supplied in synchronization with the same edge of the clock signal CLK, the clock signals (CLK1 or CLK2) supplied to the memory control circuits 26 and 28 are different from each other. In other words, the timings to start operation of the memory control circuits 26 and 28 differ according to the types of the command signals.

The same effects as those of the above-described first embodiment can be obtained in this embodiment as well. Further, in this embodiment, the clock selection circuits 32 and 34 output either the first clock signal CLK1 or the second clock signal CLK2 to the memory control circuit 26 and 28, according to the types of the command signals CMD (RD and WR). By changing the timings to start operation of the memory control circuits 26 and 28 according to the command signals CMD like this, it is possible to freely set the read latency and the write latency without restraint on each other.

Figure 14:
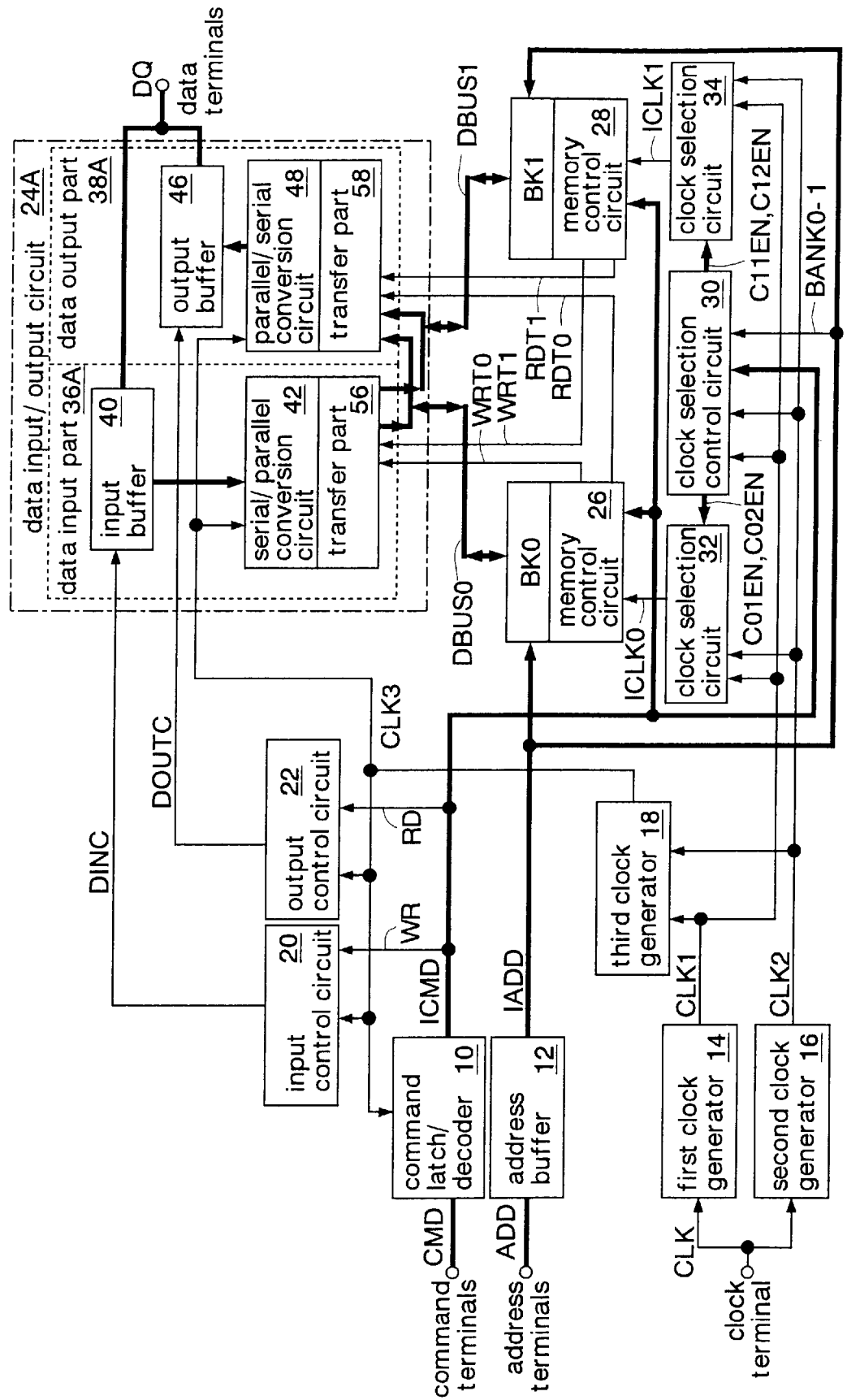
FIG. 14 is a block diagram showing a third embodiment of the semiconductor memory device according to the present invention.

FIG. 14 shows a third embodiment of the semiconductor memory device according to the present invention. The same numerals and symbols are given to designate the same circuits and signals as those explained in the description of the related art and the first embodiment, and detailed explanations thereof will be omitted.

In this embodiment, a data input/output circuit 24A is formed instead of the data input/output circuit 24 of the first embodiment. Further, the data input/output circuit 24A and the banks BK0 and BK1 are respectively connected by data bus lines DBUS0 and DBUS1. The rest of the structure is the same as that of the first embodiment.

The data input/output circuit 24A includes a data input part 36A and a data output part 38A. As to the data input part 36A, a transfer part 56 is different from the transfer part 44 of the first embodiment. As to the data output part 38A, a transfer part 58 is different from the transfer part 50 of the first embodiment.

Figure 15:
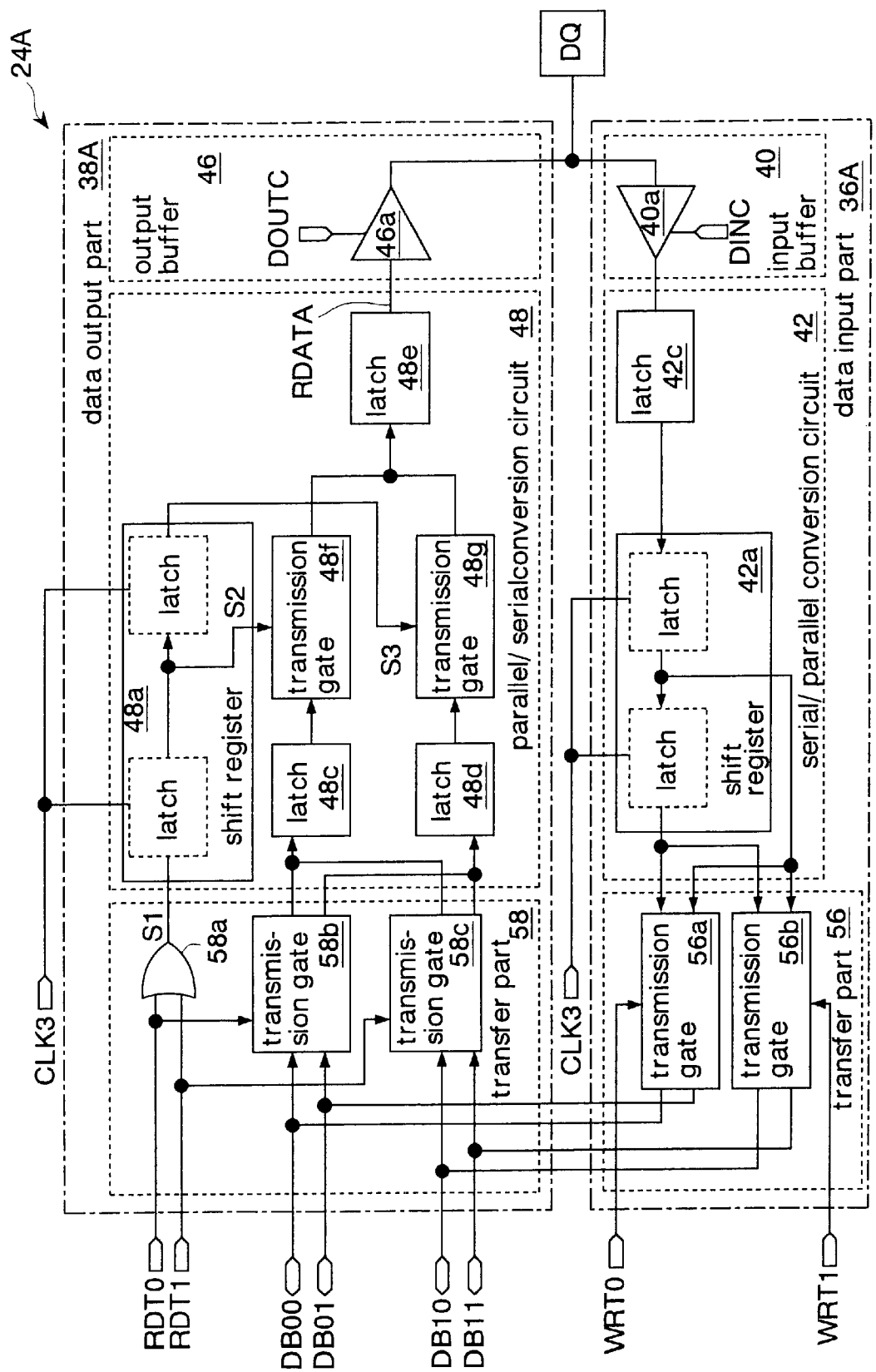
FIG. 15 is a block diagram showing the details of a data input/output circuit shown in FIG. 14.

FIG. 15 shows the details of the data input/output circuit 24A. The circuit corresponding to the 1-bit data input/output terminal DQ is shown in FIG. 15. The parallel/serial conversion circuit 48 and the output buffer 46 of the data output part 38A, and the serial/parallel conversion circuit 42 and the input buffer 40 of the data input part 36A are the same as those of the first embodiment (FIG. 6), and hence explanations thereof are omitted.

The transfer part 58 of the data output part 38A includes an OR gate 58a and transmission gates 58b and 58c. The OR gate 58a outputs OR logic of the read transfer signals RDT0 and RDT1 to the shift register 48a of the parallel/serial conversion circuit 48. The transmission gate 58b turns on in response to the read transfer signal RDT0 which is activated during the read operation of the bank BK0, and transfers the read data from the bank BK0 which are read through data bus lines DB00 and DB01 (DBUS0) to the parallel/serial conversion circuit 48. The transmission gate 58c turns on in response to the read transfer signal RDT1 which is activated during the read operation of the bank BK1, and transfers the read data from the bank BK1 which are read through data bus lines DB10 and DB11 (DBUS1) to the parallel/serial conversion circuit 48. The read data which are read through the data bus lines DB00 and DB10 are transferred to the latch 48c of the parallel/serial conversion circuit 48. The read data which are read through the data bus lines DB01 and DB11 are transferred to the latch 48d of the parallel/serial conversion circuit 48.

The transfer part 56 of the data input part 36A includes transmission gates 56a and 56b. The transmission gate 56a turns on in response to the write transfer signal WRT0 which is activated during the write operation of the bank BK0, and transfers the parallel write data which are supplied from the serial/parallel conversion circuit 42 to the data bus lines DB00 and DB01. The transmission gate 56b turns on in response to the write transfer signal WRT1 which is activated during the write operation of the bank BK1, and transfers the parallel write data which are supplied from the serial/parallel conversion circuit 42 to the data bus lines DB10 and DB11.

The same effects as those of the above-described first embodiment can be obtained in this embodiment as well. Further, the banks BK0 and BK1 and the data input/output circuit 24A are respectively connected by the different data bus lines DBUS0 and DBUS1. Hence, it is possible to minimize wiring lengths of the data bus lines DBUS0 and DBUS1 and to reduce the number of transistors to be connected to the data bus lines DBUS0 and DBUS1. Therefore, it is possible to reduce power for driving the data bus lines DBUS0 and DBUS1 and to reduce power consumption of the DDR-SDRAM during operation.

Figure 16:
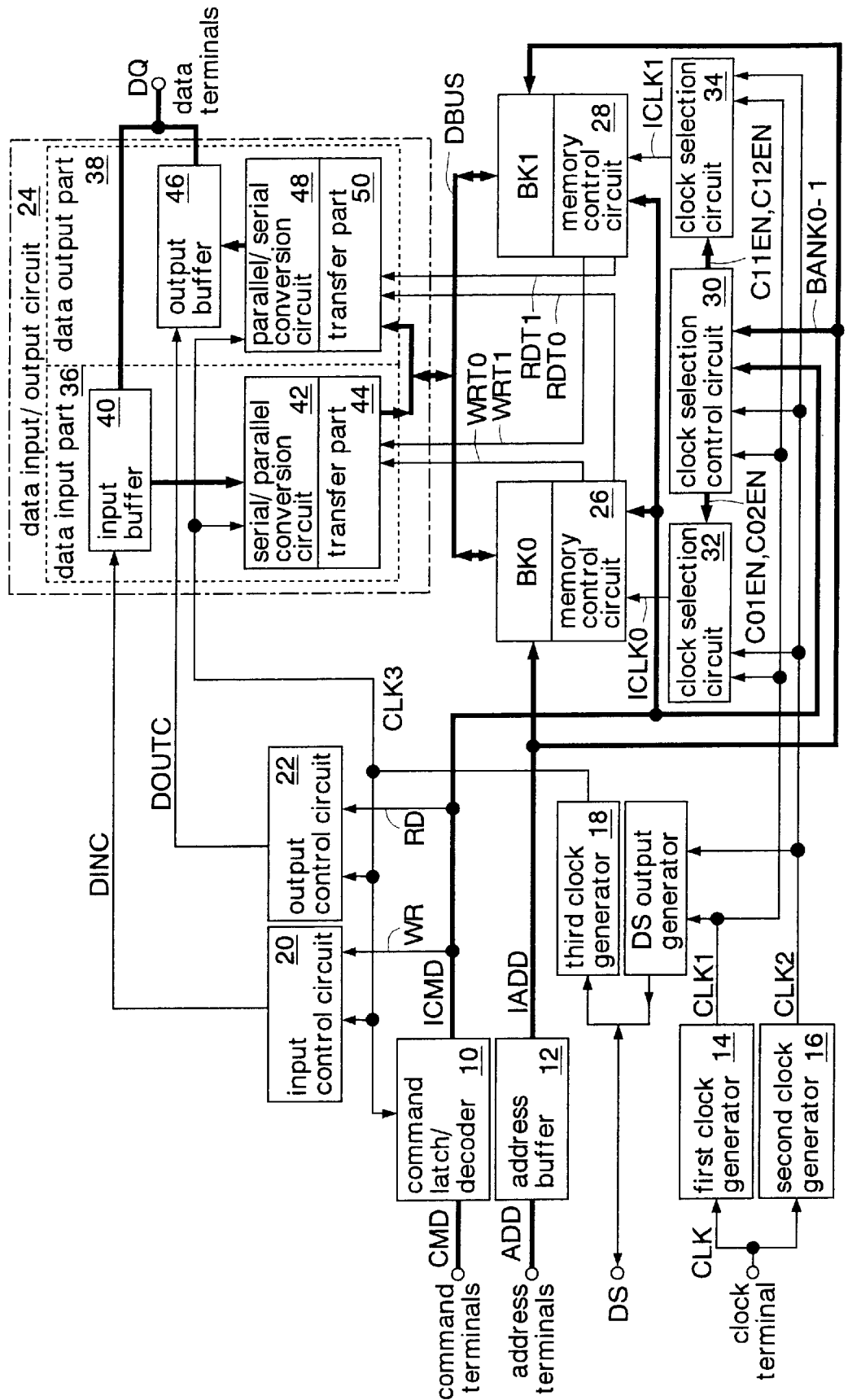
FIG. 16 is a block diagram showing the present invention applied to a semiconductor memory device having a data strobe terminal.

Incidentally, in the above-described embodiments, the example of inputting/outputting the data in synchronization with the clock signal CLK is explained. The present invention is not limited to the above embodiments. For example, as shown in FIG. 16, the data may be inputted/outputted in synchronization with a data strobe signal DS. In this case, a data strobe terminal DS is formed in the semiconductor memory device. The data strobe terminal DS inputs a write data strobe signal (DS) in synchronization with an external clock signal CLK during the write operation, and outputs a read data strobe signal (DS) in synchronization with the external clock signal CLK during the read operation. The data input/output circuit 24 outputs the read data in synchronization with both edges of the read data strobe signal, and inputs the write data in synchronization with both edges of the write data strobe signal. Thus, in the semiconductor memory device whose clock signal for inputting/outputting data is the data strobe signal DS, it is also possible to reduce power consumption of the clock synchronization circuit in the system, similarly to the first embodiment.

The invention is not limited to the above embodiments and various modifications may be made without departing from the spirit and scope of the invention. Any improvement may be made in part or all of the components.

What is claimed is:

1. A semiconductor memory device comprising:
    a command receiver circuit for receiving a command signal in synchronization with one of a rising edge and a falling edge of a clock signal;
    a data input/output circuit for starting an output of read data and an input of write data in synchronization with one of the rising edge and the falling edge of said clock signal; and
    a timing control circuit for setting a timing to start outputting the read data and a timing to start inputting the write data by said data input/output circuit at one of the rising edge and the falling edge of said clock signal, respectively, the setting being done in response to the edge of said clock signal at which said command signal has been received.

2. The semiconductor memory device according to claim 1, wherein:
    said command receiver circuit receives a write command signal for performing a write operation as said command signal; and
    said timing control circuit sets the timing to start inputting the write data in response to reception timing of the write command signal.

3. The semiconductor memory device according to claim 1, wherein:
    said command receiver circuit receives a read command signal for performing a read operation as said command signal; and
    said timing control circuit sets the timing to start outputting the read data in response to reception timing of the read command signal.

4. The semiconductor memory device according to claim 1, wherein
    said data input/output circuit comprises:
    a data output part for outputting the read data successively for a plurality of times in synchronization with both edges of said clock signal, in response to the single command signal; and
    a data input part for inputting the write data successively for a plurality of times in synchronization with the both edges of said clock signal, in response to the single command signal.

5. The semiconductor memory device according to claim 1, further comprising:
    a memory cell array;
    a first clock generator for generating a first clock signal in synchronization with the rising edge of said clock signal;
    a second clock generator for generating a second clock signal in synchronization with the falling edge of said clock signal;
    a memory control circuit for starting the read operation and the write operation from/to said memory cell array in synchronization with one of the first clock signal and the second clock signal, respectively; and
    a clock selection circuit for outputting one of said first clock signal and said second clock signal to said memory control circuit, in response to the edge of said clock signal receiving said command signal.

6. The semiconductor memory device according to claim 5, wherein:
    said command receiver circuit receives a read command signal and a write command signal each as said command signal; and said clock selection circuit outputs one of said first clock signal and said second clock signal to said memory control circuit according to a type of said command signal.

7. The semiconductor memory device according to claim 5, further comprising a third clock generator for generating a third clock signal whose frequency is double the frequency of said clock signal and is in synchronization with said clock signal, and wherein said command receiver circuit receives said command signal in synchronization with said third clock signal.

8. The semiconductor memory device according to claim 5, further comprising a third clock generator for generating a third clock signal whose frequency is double the frequency of said clock signal and is in synchronization with said clock signal, and wherein said data input/output circuit inputs the read data and outputs the write data in synchronization with said third clock signal, respectively.

9. The semiconductor memory device according to claim 8, wherein said data input/output circuit includes a parallel/serial conversion circuit for converting the parallel read data into serial data and outputting the converted serial data in synchronization with said third clock signal.

10. The semiconductor memory device according to claim 9, wherein:

said memory control circuit generates a read transfer signal synchronizing with a timing the read data is output from said memory cell array; and said data input/output circuit receives the parallel read data in synchronization with said read transfer signal.

11. The semiconductor memory device according to claim 8, wherein said data input/output circuit includes a serial/parallel conversion circuit for converting the serial write data into parallel data and outputting the converted parallel data in synchronization with said third clock signal.

12. The semiconductor memory device according to claim 11, wherein:

said memory control circuit generates a write transfer signal synchronizing with a timing the write data is supplied to said memory cell array; and said data input/output circuit outputs the serial write data to said memory cell array in synchronization with said write transfer signal.

13. The semiconductor memory device according to claim 5, further comprising a plurality of banks each including memory cells and operating independently, and wherein said memory control circuit is respectively formed corresponding to each of the banks.

14. The semiconductor memory device according to claim 13, wherein said banks are connected with said data input/output circuit by a common data bus line.

15. The semiconductor memory device according to claim 13, wherein said banks are connected respectively with said data input/output circuit by different data bus lines different from each other.

16. The semiconductor memory device according to claim 1, further comprising a data strobe terminal for inputting a write data strobe signal in synchronization with an external clock signal during write operation and outputting a read data strobe signal in synchronization with the external clock signal during read operation, and wherein said data input/output circuit outputs the read data in synchronization with both edges of the read data strobe signal and inputs the write data in synchronization with both edges of the write data strobe signal.

* * * * *